(12) United States Patent
Kato et al.

(10) Patent No.: US 9,773,835 B2
(45) Date of Patent: Sep. 26, 2017

(54) SOLID-STATE IMAGE SENSOR, IMAGING DEVICE, AND ELECTRONIC EQUIPMENT

(71) Applicant: Sony Corporation, Tokyo (JP)

(72) Inventors: Nanako Kato, Kanagawa (JP);
Toshifumi Wakano, Kanagawa (JP);
Yusuke Tanaka, Kanagawa (JP);
Yusuke Otake, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 15/395,538

(22) Filed: Dec. 30, 2016

(65) Prior Publication Data

US 2017/0110503 A1    Apr. 20, 2017

Related U.S. Application Data

(63) Continuation of application No. PCT/JP2016/058452, filed on Mar. 17, 2016.

(30) Foreign Application Priority Data

Mar. 31, 2015   (JP) .................................. 2015-072981

(51) Int. Cl.
*H01L 33/00* (2010.01)
*H01L 27/146* (2006.01)

(52) U.S. Cl.
CPC .. *H01L 27/14645* (2013.01); *H01L 27/14612* (2013.01); *H01L 27/14636* (2013.01); *H01L 27/14641* (2013.01)

(58) Field of Classification Search
CPC ......... H01L 27/14645; H01L 27/14612; H01L 27/14636; H01L 27/14641
See application file for complete search history.

(56) References Cited

U.S. PATENT DOCUMENTS

| 6,657,665 | B1 | 12/2003 | Guidash |
| 2007/0164332 | A1 | 7/2007 | Paik et al. |
| 2008/0303930 | A1 | 12/2008 | Kuroda et al. |
| 2008/0308852 | A1 | 12/2008 | Lee et al. |
| 2009/0046186 | A1 | 2/2009 | Nagai |
| 2009/0189234 | A1 | 7/2009 | Mabuchi |
| 2009/0261443 | A1 | 10/2009 | Noh et al. |
| 2009/0316026 | A1 | 12/2009 | Okumura |

(Continued)

FOREIGN PATENT DOCUMENTS

| JP | 2004-319837 A | 11/2004 |
| JP | 2010-165854 A | 7/2010 |

(Continued)

*Primary Examiner* — Jamie C Niesz
(74) *Attorney, Agent, or Firm* — Wolf, Greenfield & Sacks, P.C.

(57) ABSTRACT

The present technology relates to a solid-state image sensor, an imaging device, and electronic equipment configured such that an FD is shared by a plurality of pixels to further miniaturize the pixels at low cost without lowering of sensitivity and a conversion efficiency.
In a configuration in which a plurality of pixels are arranged with respect to at least either of one of the OCCFs or one of the OCLs, a floating diffusion (FD) is shared by a sharing unit including a plurality of pixels, the plurality of pixels including pixels of at least either of different OCCFs or different OCLs. The present technology is applicable to a CMOS image sensor.

29 Claims, 20 Drawing Sheets

(56) References Cited

U.S. PATENT DOCUMENTS

| | | |
|---|---|---|
| 2010/0020209 A1 | 1/2010 | Kim |
| 2010/0177226 A1* | 7/2010 | Itonaga ............. H01L 27/14603 348/300 |
| 2010/0230583 A1 | 9/2010 | Nakata et al. |
| 2010/0297805 A1 | 11/2010 | Mabuchi |
| 2011/0127408 A1 | 6/2011 | Yanagita et al. |
| 2011/0128400 A1 | 6/2011 | Wakano et al. |
| 2011/0234875 A1 | 9/2011 | Maeda et al. |
| 2011/0273597 A1 | 11/2011 | Ishiwata |
| 2012/0009720 A1 | 1/2012 | Shim et al. |
| 2012/0199883 A1 | 8/2012 | Kobayashi |
| 2012/0228474 A1 | 9/2012 | Sato |
| 2012/0314109 A1 | 12/2012 | Murakami et al. |
| 2013/0002915 A1 | 1/2013 | Itonaga et al. |
| 2013/0015324 A1 | 1/2013 | Park et al. |
| 2013/0049082 A1* | 2/2013 | Kato .................... H04N 5/3745 257/292 |
| 2013/0088621 A1 | 4/2013 | Hamada |
| 2013/0182154 A1 | 7/2013 | Kimura |
| 2013/0194471 A1 | 8/2013 | Yamashita |
| 2014/0015025 A1 | 1/2014 | Ahn et al. |
| 2014/0184864 A1 | 7/2014 | Itonaga et al. |
| 2014/0217474 A1 | 8/2014 | Lee et al. |
| 2014/0225173 A1 | 8/2014 | Kim et al. |
| 2014/0239433 A1 | 8/2014 | Wakano |
| 2014/0253905 A1 | 9/2014 | Kim et al. |
| 2014/0347537 A1 | 11/2014 | Hamada |
| 2015/0002709 A1* | 1/2015 | Masagaki .......... H04N 5/37457 348/280 |
| 2015/0092094 A1 | 4/2015 | Itonaga et al. |
| 2015/0115291 A1 | 4/2015 | Kim et al. |
| 2015/0116565 A1 | 4/2015 | Kim et al. |
| 2015/0179691 A1 | 6/2015 | Yanagita et al. |
| 2015/0187844 A1 | 7/2015 | Lee et al. |
| 2015/0334323 A1 | 11/2015 | Egawa |
| 2015/0381917 A1* | 12/2015 | Mabuchi ........... H01L 27/14621 348/302 |
| 2016/0006970 A1 | 1/2016 | Itonaga et al. |
| 2016/0043119 A1 | 2/2016 | Lee et al. |
| 2016/0056200 A1 | 2/2016 | Lee et al. |
| 2016/0204160 A1 | 7/2016 | Itonaga et al. |
| 2016/0336364 A1 | 11/2016 | Itonaga et al. |
| 2017/0013211 A1* | 1/2017 | Kato .................. H04N 5/37457 |

FOREIGN PATENT DOCUMENTS

| | | | |
|---|---|---|---|
| JP | 2011-086888 A | | 4/2011 |
| JP | 2011-155596 A | | 8/2011 |
| JP | 2014-033054 A | | 2/2014 |
| JP | 2015-012303 A | | 1/2015 |
| JP | 2015-162646 A | | 9/2015 |
| JP | 2014-33054 | * | 2/2017 ........... H01L 27/146 |

* cited by examiner

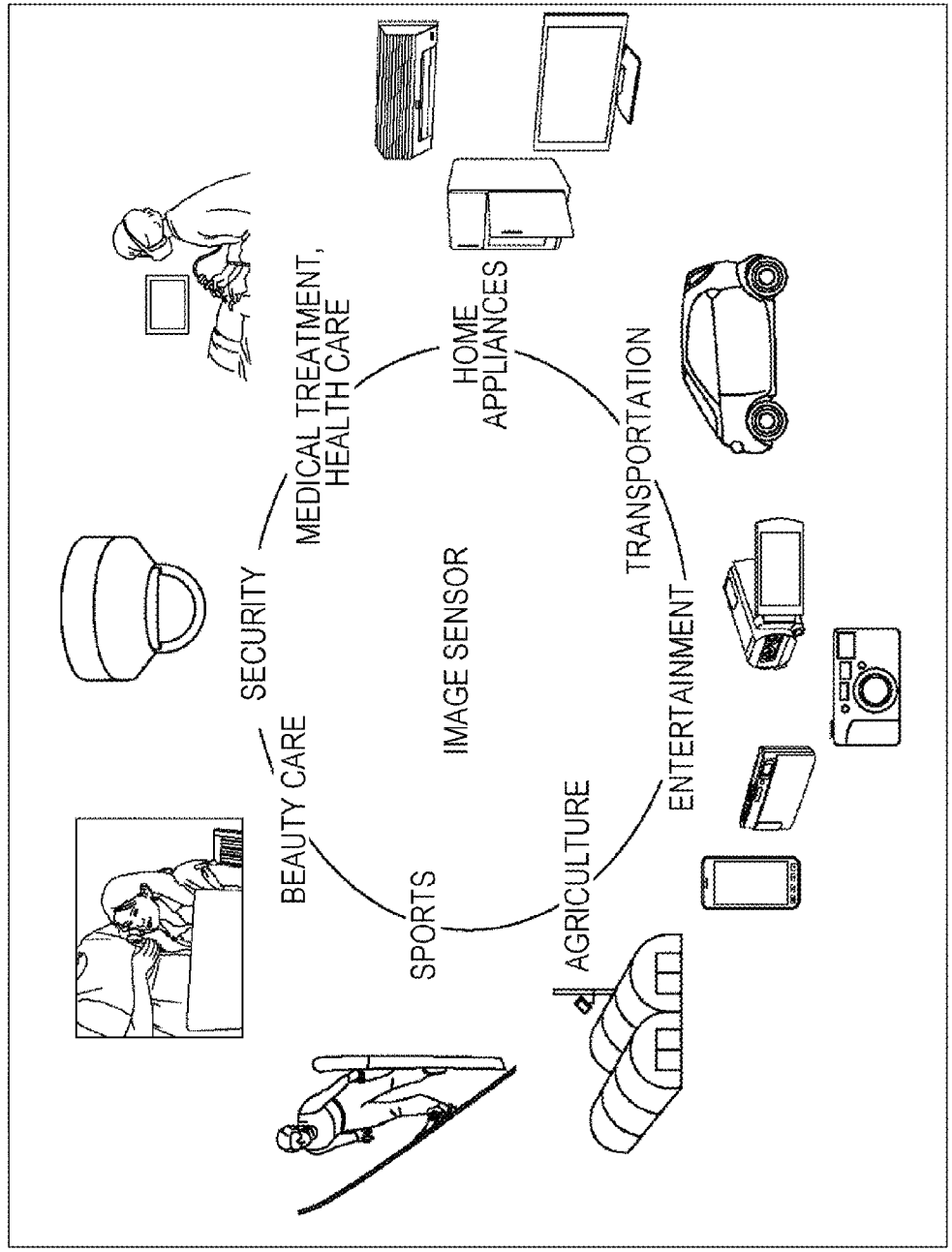

SOLID-STATE IMAGE SENSOR, IMAGING DEVICE, AND ELECTRONIC EQUIPMENT

CROSS REFERENCE TO RELATED APPLICATIONS

This application is a continuation of International Application No. PCT/JP2016/058452, filed Mar. 17, 2016, which claims priority to Japanese Patent Application JP 2015-072981, filed Mar. 31, 2015, each of which is hereby incorporated by reference in its entirety.

TECHNICAL FIELD

The present technology relates to a solid-state image sensor, an imaging device, and electronic equipment. The present technology particularly relates to a solid-state image sensor, an imaging device, and electronic equipment configured such that an FD is shared by a plurality of pixels to further miniaturize the pixels at low cost without lowering of sensitivity and a conversion efficiency.

BACKGROUND ART

In a complementary metal oxide semiconductor (CMOS) image sensor called a "dual pixel," a plurality of pixels (photo diodes) (hereinafter sometimes simply referred to as a "PD") sharing an on-chip lens (hereinafter sometimes simply referred to as an "OCL") shares the same floating diffusion (hereinafter sometimes simply referred to as an "FD").

More specifically, the CMOS image sensor called the "dual pixel" has the structure of sharing an FD by two pixels. In such an image sensor, transfer gates (hereinafter sometimes simply referred to as "TRGs") of two pixels are arranged adjacent to each other, and a polysilicon (Poly-Si) gate has a two-layer structure. With such a structure, narrowing of an FD region and expansion of a PD region can be realized, and as a result, sensitivity and a saturation signal amount (hereinafter sometimes referred to as a "Qs") can be improved.

CITATION LIST

Patent Document

Patent Document 1: Japanese Patent Application Laid-Open No. 2004-319837

SUMMARY OF THE INVENTION

Problems to be Solved by the Invention

However, in the above-described CMOS image sensor called the "dual pixel," the FD is shared only by the pixels sharing the OCL, and for this reason, more miniaturization of a pixel size results in a lower degree of freedom in a layout.

In the case of closely arranging pixels in the front-end-of-line (FEOL) layout of the substrate surface on which elements are arranged, the maximum PD region is ensured, and for this reason, it is inevitable to reduce the width (the L length) of an amplification transistor (hereinafter sometimes referred to as an "AMP transistor"). This might lead to worsening of random noise.

On the other hand, in order to avoid worsening of the random noise, it is inevitable to narrow the PD region. This might lead to lowering of sensitivity and a Qs.

Further, in order for the back-end-of-line (BEOL) layout of the substrate surface on which wiring is made to accept high dynamic range (HDR) driving, the number of control lines is higher, and it is more difficult to arrange such control lines.

Moreover, in the case of requiring a plurality of vertical signal lines (hereinafter sometimes simply referred to as "VSLs") to realize high-speed reading, the spacing between adjacent ones of the VSLs needs to be small, and for this reason, the influence of parasitic capacitance due to a capacitive coupling between adjacent ones of the VSLs becomes greater.

In addition, although the number of line layers may be increased for the above-described purposes, not only a cost increases due to such an increase in the number of line layers, but also parasitic capacitance due to a capacitive coupling between a FD line and a peripheral line increases by a complicated layout of the FD line. For these reasons, a conversion efficiency might be lowered.

The present technology has been made in view of the above-described situation, and particularly intended to further miniaturize pixels at low cost by sharing of a OCCF by a plurality of pixels without lowering of sensitivity and a conversion efficiency.

Solutions to Problems

A solid-state image sensor of one aspect of the present technology includes at least either of on-chip color filters (OCCFs) configured to extract light having a predetermined wavelength from incident light or on-chip lenses (OCLs) configured to collect the incident light, photo diodes configured to use, as incident light, light extracted from at least either of the light collected by the OCCFs or the OCLs and having the predetermined wavelength to generate, for each pixel unit, charge corresponding to the amount of the incident light by a photoelectric effect, and a floating diffusion (FD) configured to accumulate the charge generated by the photo diodes to apply voltage corresponding to the accumulated charge to a gate of an amplification transistor. In a configuration in which a plurality of pixels are arranged with respect to at least either of one of the OCCFs or one of the OCLs, the FD is shared by a sharing unit including a plurality of pixels, the plurality of pixels including pixels of at least either of different OCCFs or different OCLs.

The photo diodes of two pixels may be arranged with respect to at least either of one of the OCCFs or one of the OCLs.

The sharing unit may include the pixels corresponding to at least either of the OCCFs or the OCLs adjacent to each other in a horizontal direction.

The sharing unit may include the pixels corresponding to at least any ones of two OCCFs, four OCCFs, two OCLs, and four OCLs adjacent to each other in the horizontal direction.

The sharing unit may include the pixels corresponding to at least either of the OCCFs or the OCLs adjacent to each other in a vertical direction.

The sharing unit may include the pixels corresponding to at least any ones of two OCCFs, four OCCFs, two OCLs, and four OCLs adjacent to each other in the vertical direction.

The sharing unit may include the pixels corresponding to at least either of the OCCFs or the OCLs adjacent to each other in horizontal and vertical directions.

The sharing unit may include the pixels corresponding to at least either of the OCCFs or the OCLs adjacent to each other such that there are two OCCFs or two OCLs in the horizontal direction and two OCCFs or two OCLs in the vertical direction.

The sharing unit may include the pixels corresponding to at least either of the OCCFs or the OCLs extracting light having an identical wavelength.

The solid-state image sensor may further include: a reset transistor; a transfer transistor; and the amplification transistor.

The solid-state image sensor may further include: a reset transistor; a transfer transistor; the amplification transistor; a selection transistor.

A dummy transistor may be disposed at such a position that arrangement intervals with respect to the reset transistor, the amplification transistor, and the selection transistor are in symmetrical positions in an arrangement direction of the reset transistor, the amplification transistor, and the selection transistor.

The solid-state image sensor may further include: a vertical signal line configured to transfer a pixel signal output from the amplification transistor, and the vertical signal line may be shared by the sharing units.

A source/drain may be shared by the sharing units.

An imaging device of another aspect of the present technology includes at least either of on-chip color filters (OCCFs) configured to extract light having a predetermined wavelength from incident light or on-chip lenses (OCLs) configured to collect the incident light, photo diodes configured to use, as incident light, light extracted from at least either of the light collected by the OCCFs or the OCLs and having the predetermined wavelength to generate, for each pixel unit, charge corresponding to the amount of the incident light by a photoelectric effect, and a floating diffusion (FD) configured to accumulate the charge generated by the photo diodes to apply voltage corresponding to the accumulated charge to a gate of an amplification transistor. In a configuration in which a plurality of pixels are arranged with respect to at least either of one of the OCCFs or one of the OCLs, the FD is shared by a sharing unit including a plurality of pixels, the plurality of pixels including pixels of at least either of different OCCFs or different OCLs.

Electronic equipment of another aspect of the present technology includes: at least either of on-chip color filters (OCCFs) configured to extract light having a predetermined wavelength from incident light or on-chip lenses (OCLs) configured to collect the incident light; photo diodes configured to use, as incident light, at least either of the light having the predetermined wavelength and extracted by the OCCFs or the light collected by the OCLs to generate, for each pixel unit, charge corresponding to an amount of the incident light by a photoelectric effect; and a floating diffusion (FD) configured to accumulate the charge generated by the photo diodes to apply voltage corresponding to the accumulated charge to a gate of an amplification transistor, and in a configuration in which a plurality of pixels are arranged with respect to at least either of one of the OCCFs or one of the OCLs, the FD is shared by a sharing unit including a plurality of pixels, the plurality of pixels including pixels of at least either of different OCCFs or different OCLs.

According to such aspects of the present technology, the light having the predetermined wavelength is extracted from the incident light by at least either of the on-chip color filters (OCCFs) or the on-chip lenses (OCLs) configured to collect the incident light. The photo diodes use, as the incident light, at least either of the light extracted by the OCCFs and having the predetermined wavelength or the light collected by the OCLs to generate, for each pixel unit, the charge corresponding to the amount of the incident light by the photoelectric effect. The floating diffusion (FD) accumulates the charge generated by the photo diodes to apply the voltage corresponding to the accumulated charge to the gate of the amplification transistor. The FD is shared by a sharing unit including the plurality of pixels, the plurality of pixels including a set of pixels being arranged corresponding to at least one of the OCCFs or OCLs and another set of pixels being arranged corresponding to at least another one of the OCCFs or OCLs.

Effects of the Invention

According to the aspects of the present technology, an FD is shared by the plurality of pixels, and therefore, the pixels can be further miniaturized at low cost without lowering of sensitivity and a conversion efficiency.

BRIEF DESCRIPTION OF DRAWINGS

FIG. 20 is a diagram of use examples of the solid-state image sensor.

MODE FOR CARRYING OUT THE INVENTION

Examples of the mode for carrying out the present invention will be described below, but the present invention is not limited to the examples below.

First Embodiment

<Circuit Configuration Example of 3Tr. Type Solid-State Image Sensor>

Figure 1:
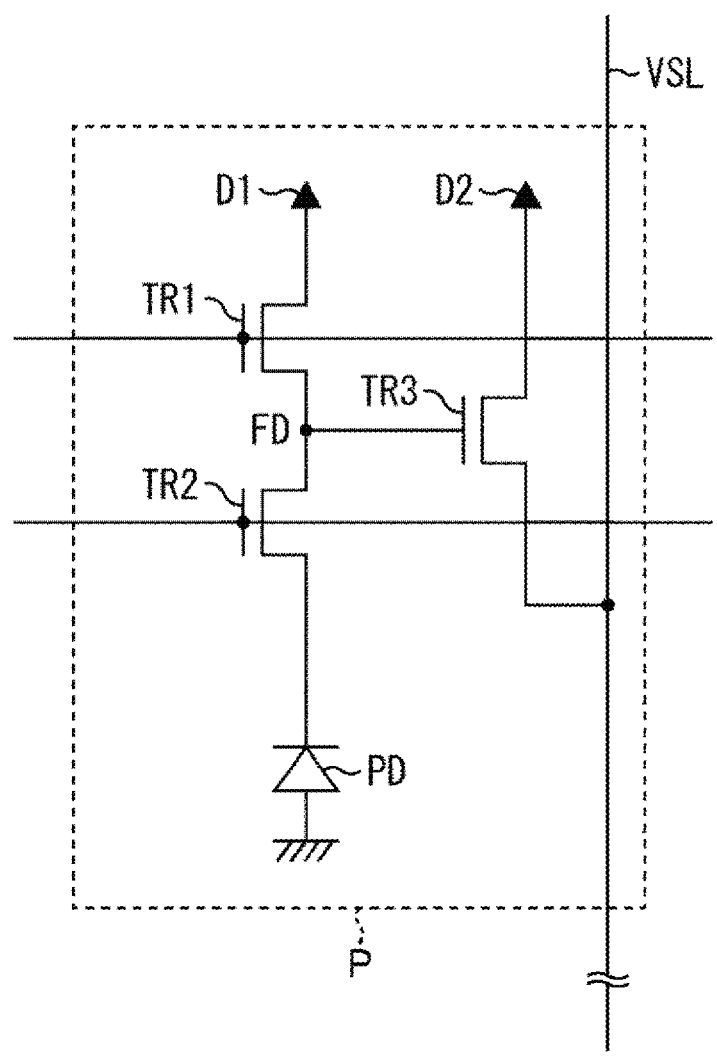
FIG. 1 is a diagram for describing a circuit configuration example of a 3Tr. type solid-state image sensor to which the present technology is applied.

FIG. 1 illustrates a circuit configuration example of a pixel unit forming a solid-state image sensor to which the present technology is applied.

The circuit configuration example of a pixel P of the solid-state image sensor of FIG. 1 includes a reset transistor TR1, a transfer transistor TR2, an amplification transistor TR3, a floating diffusion FD (hereinafter sometimes simply referred to as an "FD"), a photo diode PD (hereinafter sometimes simply referred to as a "PD"), and a vertical signal line VSL.

Since the solid-state image sensor with the configuration of FIG. 1 is a solid-state image sensor including three transistors in total, i.e., the reset transistor TR1, the transfer transistor TR2, and the amplification transistor TR3, such a solid-stage image sensor is a solid-state image sensor called a "3Tr. type."

The PD is configured to generate, by photoelectric conversion, charge corresponding to the amount of incident light and accumulate the generated charge.

The transfer transistor TR2 is a transistor configured to open/close according to a transfer signal applied to a gate. When the transfer signal is at a high level, the transfer transistor TR2 is turned ON to transfer the charge accumulated in the PD to the FD.

Electrons are also accumulated in the FD according to the number of electrons transferred from the PD. Moreover, the potential of the FD is applied to a gate of the amplification transistor TR3.

The reset transistor TR1 is a transistor configured to open/close according to a reset signal TR1. When the reset transistor TR1 is ON, the charge accumulated in the FD is output to a drain terminal D1.

The amplification transistor TR3 is a transistor configured to open/close according to an amplification control signal. The amplification transistor TR3 uses input voltage corresponding to the charge accumulated in the FD to amplify voltage applied from a drain terminal D2, and then, outputs the amplified voltage as a pixel signal to the vertical signal line VSL.

That is, the PD and the FD are reset in such a manner that the reset transistor TR1 and the transfer transistor TR2 are turned ON.

Subsequently, turning OFF of the transfer transistor TR2 brings about a PD exposure state. Accordingly, the charge corresponding to the amount of incident light is, by photoelectric conversion, generated sequentially in the PD, and then, is accumulated in the PD.

In such a state, when the transfer transistor TR2 is turned ON, the charge accumulated in the PD is transferred to the FD.

At this point, when the voltage corresponding to the charge accumulated in the PD is input to the gate of the amplification transistor TR3, the amplification transistor TR3 amplifies the voltage applied from the drain terminal D2 to output the amplified voltage as the pixel signal to the vertical signal line VSL.

Subsequently, similar operation is repeated to output the pixel signal at predetermined time intervals.

<Circuit Configuration Example of 4Tr. Type Solid-State Image Sensor>

Next, a circuit configuration example of a 4Tr. type solid-state image sensor will be described with reference to FIG. 2.

The circuit configuration example of a pixel P of the 4Tr. type solid-state image sensor includes a reset transistor TR11, a transfer transistor TR12, an amplification transistor TR13, a selection transistor TR14, an FD, a PD, and a vertical signal line VSL.

The reset transistor TR11, the transfer transistor TR12, the amplification transistor TR13, the floating diffusion FD, the PD, and the vertical signal line VSL have the same functions as those of the reset transistor TR1, the transfer transistor TR2, the amplification transistor TR3, the floating diffusion FD, the PD, and the vertical signal line VSL in FIG. 1, except for the selection transistor TR14. Thus, description of these sections will not be repeated.

Figure 2:
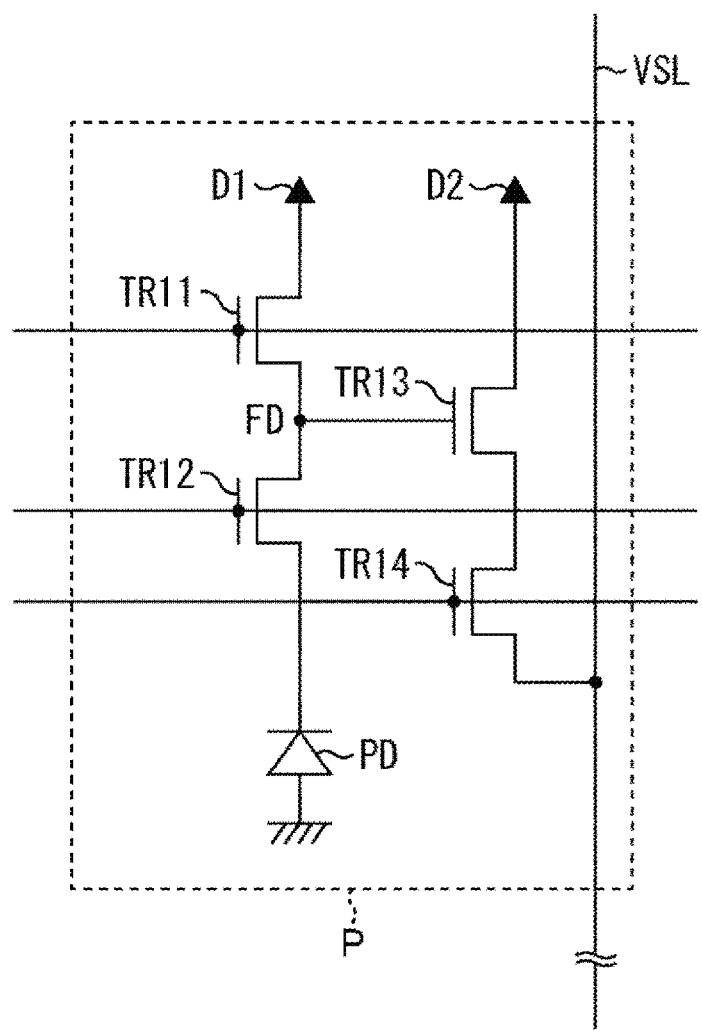
FIG. 2 is a diagram for describing a circuit configuration example of a 4Tr. type solid-state image sensor to which the present technology is applied.

That is, the 4Tr. type solid-state image sensor of FIG. 2 is a solid-state image sensor including four transistors, i.e., the reset transistor TR11, the transfer transistor TR12, the amplification transistor TR13, and the selection transistor TR14. Thus, such a solid-stage image sensor is called a "4Tr. type."

The selection transistor TR14 is a transistor configured to open/close according to a selection signal applied to a gate. When the selection signal is at a high level, the selection transistor TR14 is turned ON, and then, a pixel signal output according to the voltage of the FD applied to a gate of the amplification transistor TR13 is output to the vertical signal line VSL.

That is, in the case of the 4Tr. type solid-state image sensor, a pixel signal of a selected pixel P is output by the selection transistor TR14.

<FD Sharing by Pixels>

Next, a circuit configuration example in the case of sharing an FD by a plurality of pixels will be described with reference to FIG. 3.

Figure 3:
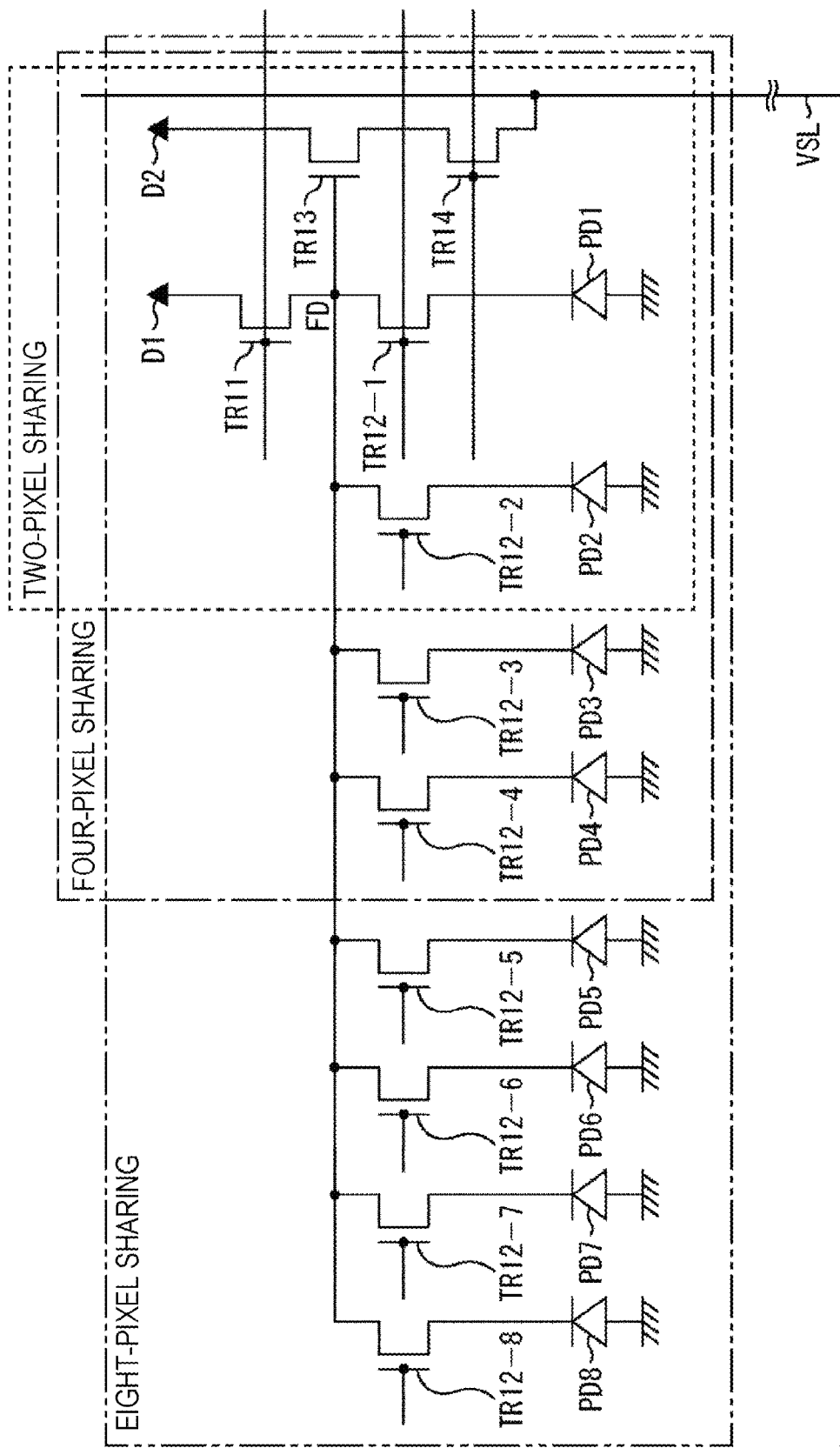
FIG. 3 is a diagram for describing a circuit configuration example of a solid-state image sensor configured such that an FD is shared by a plurality of pixels.

FIG. 3 illustrates the circuit configuration example where transfer transistors TR12-1 to TR12-8 each coupled to a cathode of a corresponding one of PD 1 to PD 8 between a source and a drain are provided for the same FD.

That is, FIG. 3 illustrates the circuit configuration in which eight pixels of the PD 1 to PD 8 shares the FD.

With such a configuration, the FD can be used for a pixel of the PD 1 in such a manner that the transfer transistor TR12-1 is controlled to ON or OFF with the transfer transistors TR12-2 to TR12-8 being OFF, for example. Thus, in the circuit configuration of the solid-state image sensor of FIG. 3, ON/OFF of the transfer transistors 12-1 to 12-8 is controlled so that the FD can be switched and used for each of the PD 1 to PD 8. In the present embodiment, an FD (including the reset transistor TR11, the transfer transistor TR12, the amplification transistor TR13, the selection transistor TR14, and the vertical signal line VSL) can be shared by eight pixels.

For example, as illustrated in the region surrounded by a dashed line in FIG. 3, the configuration including the transfer transistors TR12-1, TR12-2 and the PD 1, PD 2 in addition to the reset transistor TR11, the transfer transistor TR12, the amplification transistor TR13, the selection transistor TR14, and the vertical signal line VSL realizes two-pixel sharing, i.e., sharing of the FD by two pixels of the PD 1, PD 2.

Moreover, as illustrated in, e.g., the region surrounded by a chain line in FIG. 3, the configuration including the transfer transistors TR12-1 to TR12-4 and the PD 1 to PD 4 in addition to the reset transistor TR11, the transfer transistor TR12, the amplification transistor TR13, the selection transistor TR14, and the vertical signal line VSL realizes four-pixel sharing, i.e., sharing of the FD by four pixels.

Further, as illustrated in, e.g., the region surrounded by a chain double-dashed line in FIG. 3, the configuration including the transfer transistors TR12-1 to TR12-8 and the PD 1 to PD 8 in addition to the reset transistor TR11, the transfer transistor TR12, the amplification transistor TR13, the selection transistor TR14, and the vertical signal line VSL realizes eight-pixel sharing, i.e., sharing of the FD by eight pixels.

Further, the number of PDs other than above can be coupled to a common FD via transfer transistors.

With such a configuration, in further pixel miniaturization, the aperture ratio of the PD can be improved, and pixel miniaturization can be made without lowering of sensitivity and a decrease in a saturation signal amount Qs.

Moreover, the vertical signal line VSL can be shared by a plurality of pixels, but there is a concern on signal interference due to a capacitive coupling between the vertical signal lines VSL. That is, in the case where there are adjacent vertical signal lines VSL1, VSL2 close to each other, when an output signal of the vertical signal line VSL1 is present and an output signal of the vertical signal line VSL2 is absent, there is a concern that the output signal of the vertical signal line VSL1 is on the vertical signal line VSL2 and is detected as a false signal. On the other hand, sharing of the vertical signal line VSL by the plurality of pixels can ensure a sufficient space between adjacent ones of the vertical signal lines VSL. As a result, the L length of the amplification transistor (AMP) TR13 can be ensured, and worsening of random noise can be suppressed.

Note that the 4Tr. type solid-state image sensor has been described as an example with reference to FIG. 3, and needless to say, the circuit configuration of the 3Tr. type solid-state image sensor is applicable. Moreover, the group of a plurality of pixels sharing and using an FD as described above is hereinafter referred to as a sharing unit. Thus, in FIG. 3, the region surrounded by the dashed line is the sharing unit for realizing two-pixel sharing, the region surrounded by the chain line is the sharing unit for realizing four-pixel sharing, and the region surrounded by the chain double-dashed line is the sharing unit for realizing eight-pixel sharing.

<Layout in Sharing of FD by 4Tr. Type Pixels of 4×2>

Next, the layout of a solid-state image sensor formed of a front-end-of-line (FEOL) backside illumination type complementary metal oxide semiconductor (CMOS) image sensor in the case where an FD is shared by 4Tr. type pixels of 4×2 will be described with reference to FIG. 4.

Figure 4:
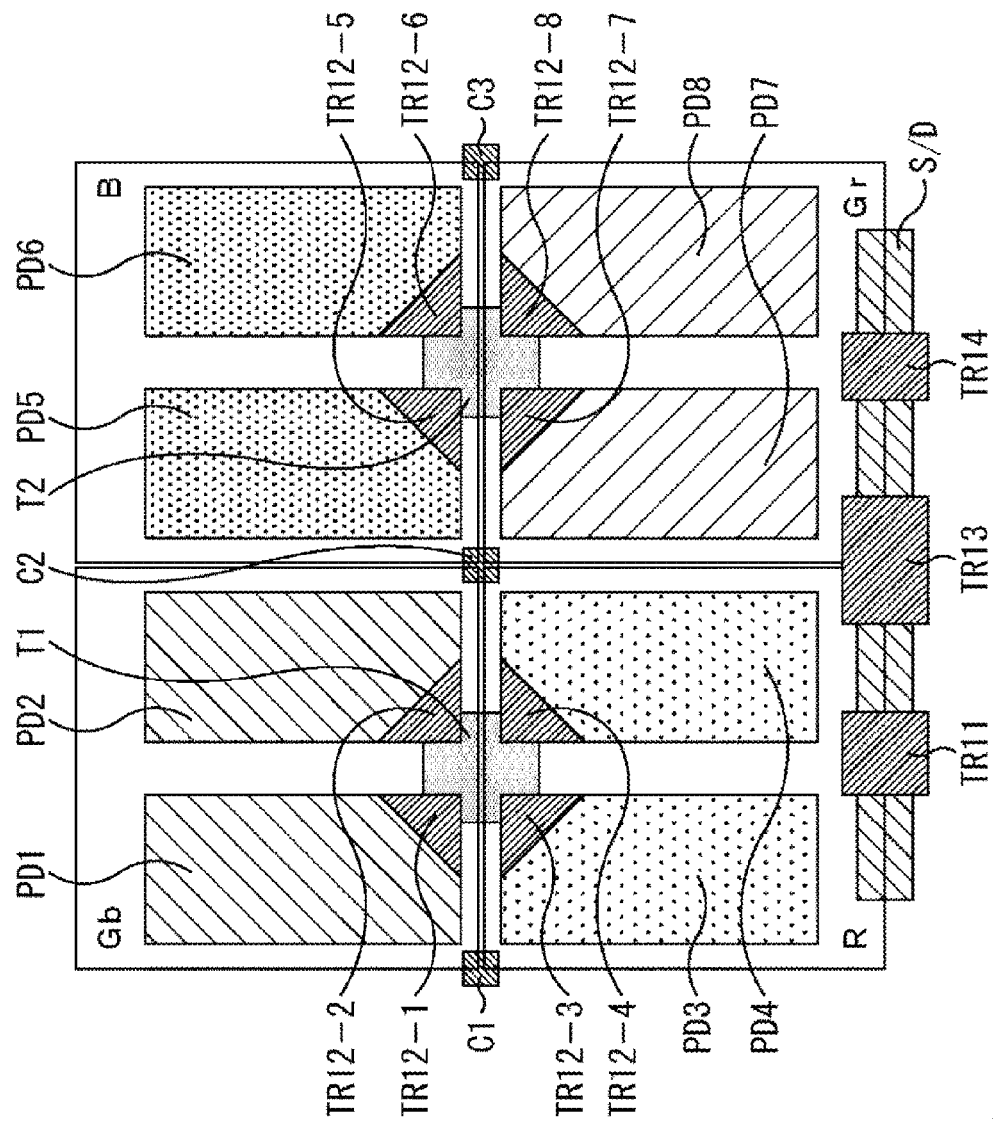
FIG. 4 is a view for describing the layout of a configuration example of a first embodiment of the solid-state image sensor to which the present technology is applied.

In FIG. 4, for each on-chip color filter (OCCF), two vertically-elongated PDs are arranged in the horizontal direction, and these two PDs continuously arranged in the horizontal direction form a square region.

More specifically, four OCCFs with a Bayer array of Gb, R, B, Gr are provided in the order of the upper left side, the lower left side, the upper right side, the lower right side. For the OCCF for Gb, rectangular PD 1, PD 2 whose vertical length is longer than the horizontal length are provided. Similarly, the OCCF for R is provided with PD 3, PD 4, the OCCF for B is provided with PD 5, PD 6, and the OCCF for Gr is provided with PD 7, PD 8.

That is, in FIG. 4, a common FD is provided for the total of eight pixels, each of the total of four OCCFs of two in the horizontal direction×two in the vertical direction being provided with two pixels arranged in the horizontal direction. These eight pixels form the sharing unit for the FD.

Transfer transistors TR12-1 to TR12-4 are provided respectively at the corners of the PD 1 to PD 4 such that the corners respectively contact the positions of a square terminal T1 facing the corners, the square terminal T1 being provided at a center position of the boundary between the OCCFs for Gb, R and being coupled to the FD. Similarly, transfer transistors TR12-5 to TR12-8 are provided respectively at the corners of the PD 5 to PD 8 such that the corners respectively contact the positions of a square FD (T2) facing the corners, the square FD being provided at a center position of the boundary between the OCCFs for B, Gr.

Further, on the lower side as viewed in FIG. 4, the reset transistor TR11, the amplification transistor TR13, and the selection transistor TR14 coupled to a line coupled to the common terminals T1, T2 and the FD are provided in this order from the left side to extend across an S/D (a source/drain).

In addition, well contacts C1 to C3 are provided respectively at the corners of the OCCFs at the boundary between each of two upper OCCFs and each of two lower OCCFs.

The horizontal length of the amplification transistor TR13 as viewed in FIG. 4 can be increased by pixel sharing, and as a result, worsening of random noise can be prevented. Further, since the FD is shared by the plurality of pixels covered by the plurality of OCCFs, a PD area can be expanded. Thus, sensitivity characteristics can be improved, and a saturation signal amount Qs can be improved. Moreover, arrangement of the transfer transistors TR12-1 to TR12-4 and arrangement of the transfer transistors TR12-5 to TR12-8 relative to the PDs and symmetry among the reset transistor TR11, the amplification transistor TR13, and the selection transistor TR14 can reduce photo response non-uniformity (PRNU).

Output is made from the same FD for Gr, Gb, and therefore, the signal difference can be reduced.

Figure 5:
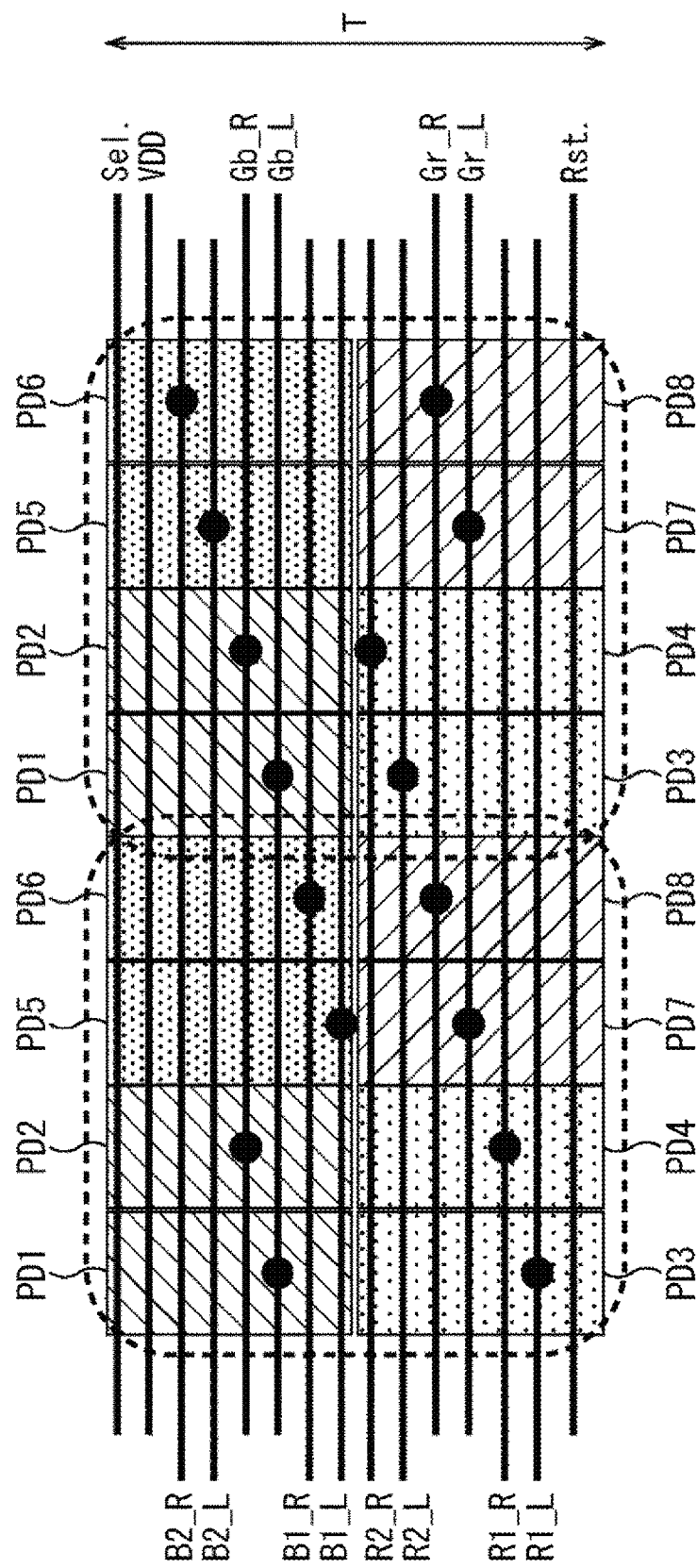
FIG. 5 is a view for describing the back-end-of-line (BEOL) layout of the solid-state image sensor of FIG. 4.

For the back-end-of-line (BEOL) layout of the solid-state image sensor of FIG. 4, for example, when different exposure times are set for two PDs of each OCCF and wiring is made to accept high dynamic range (HDR) driving for expanding a dynamic range, such wiring is as illustrated in FIG. 5.

More specifically, FIG. 5 illustrates the wiring when two sharing units are arranged in the horizontal direction, each sharing unit including eight pixels of 4×2 sharing an FD. Each black circle in FIG. 5 indicates the point where each line is electrically coupled.

That is, the lines of FIG. 5 include, in the order from the upper side, a control signal line Sel for a selection transistor TR14; a power supply line VDD; a transfer control signal line B2_R for a PD 6 of a right pixel of an OCCF for B in the right sharing unit surrounded by a dashed line; a transfer control signal line B2_L for a PD 5 of a left pixel of the OCCF for B in the right sharing unit; a transfer control signal line Gb_R for a PD 2 of a right pixel in each OCCF for Gb; a transfer control signal line Gb_L for a PD 1 of a left pixel in each OCCF for Gb; a transfer control signal B1_R for a PD 6 of a right pixel of an OCCF for B in the left sharing unit; and a transfer control signal line B1_L for a PD 5 of a left pixel of the OCCF for B in the left sharing unit.

Further, the lines below the above-described lines include, in the order from the upper side, a transfer control signal line R2_R for a PD 4 of a right pixel of an OCCF for R in the right sharing unit; a transfer control signal line R2_L for a PD 3 of a left pixel of the OCCF for R in the right sharing unit; a transfer control signal line Gr_R for a PD 8 of a right pixel in each OCCF for Gr; a transfer control signal line Gr_L for a PD 7 of a left pixel in each OCCF for Gr; a transfer control signal line R1_R for a PD 4 of a right pixel of an OCCF for R in the left sharing unit; a transfer control signal line R1_L for a PD 3 of a left pixel of an OCCF for R in the left sharing unit; and a control signal line Rst for the reset transistor TR11.

That is, for the sharing units each including the pixels of 4×2 sharing the FD, two types of connection patterns are alternately provided in the horizontal direction.

Even in the case of requiring the above-described wiring, a vertical distance corresponds to two pixels, and therefore, the degree of freedom in a layout can be increased. Further, although not shown in the figure, the source/drain may be also shared by a plurality of sharing units, and similar advantageous effects can be obtained.

Figure 6:
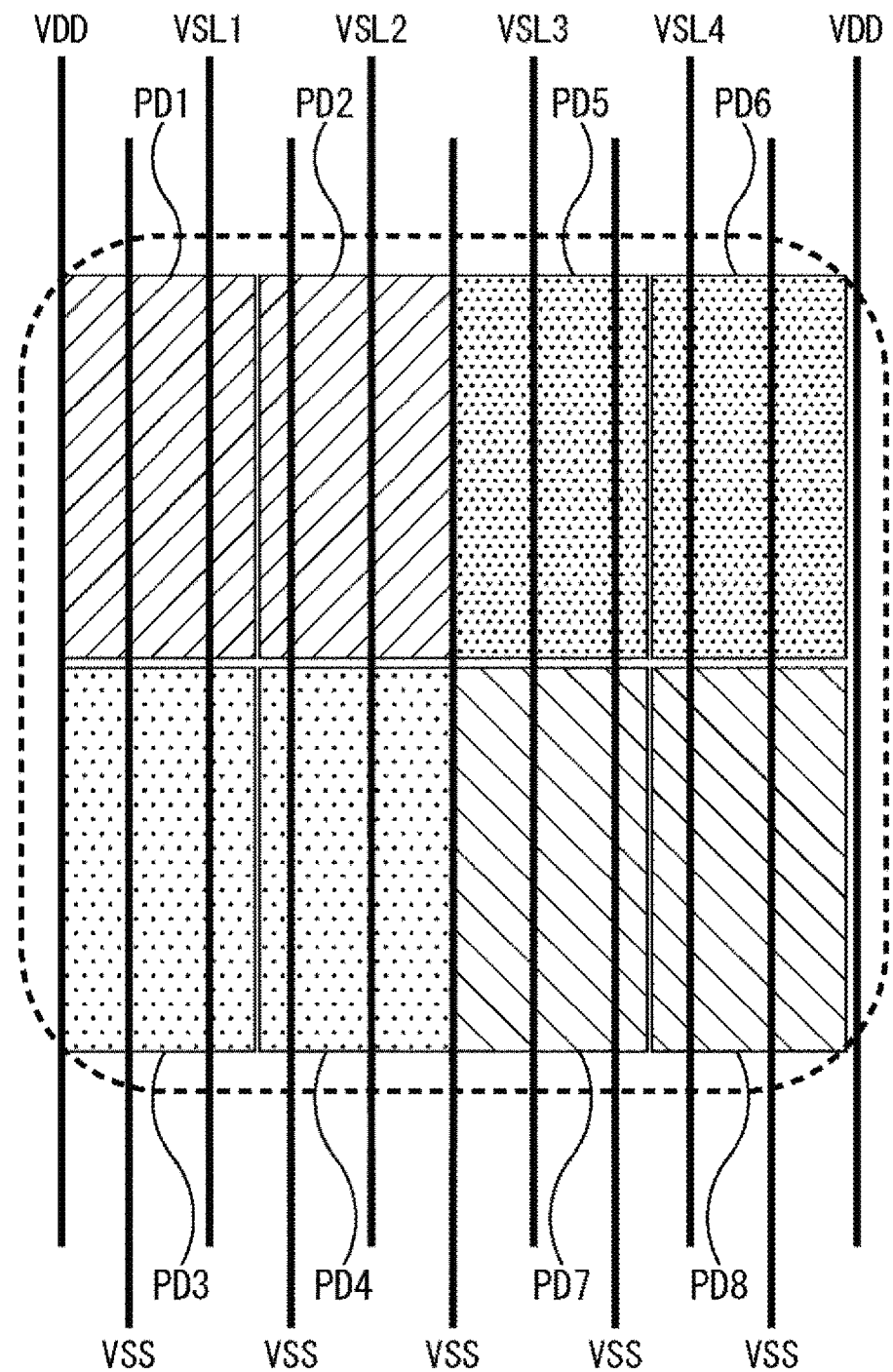
FIG. 6 is a view for describing the layout of a plurality of vertical signal lines of the solid-state image sensor of FIG. 4.

Further, for the vertical signal line VSL, there is a space corresponding to four pixels in the horizontal direction (i.e., corresponding to two pixels in the vertical direction). Thus, wiring of a plurality of vertical signal lines VSL can be made. For example, in a sharing unit including pixels of 4×2 as illustrated in FIG. 6, four vertical signal lines VSL1 to VSL4 are provided, and a power supply line VDD is provided at each end of the sharing unit. Further, a shield VSS is provided between adjacent ones of the vertical signal lines VSL, and therefore, interference due to a capacitive coupling can be reduced.

Note that the configuration in which two PDs elongated in the vertical direction are, for each OCCF, provided in the horizontal direction has been described above. However, when such an OCCF is formed of a pixel, a PD can be utilized as a phase detection pixel (a ZAF pixel). That is, one of these two adjacent PDs elongated in the vertical direction can be utilized as a left light-shielded pixel whose left half is not shaded, and the other PD can be utilized as a right light-shielded pixel whose right half is not shaded. Images acquired by these PDs shift to right and left depending on a focal length. Thus, the image acquired by the PD corresponding to the left light-shielded pixel and the image acquired by the PD corresponding to the right light-shielded pixel coincident with each other at a focal point, but a phase difference between these images is caused at a point shifted from the focal point depending on a difference in the focal length between the images. For this reason, the difference in the focal length is obtained on the basis of the phase difference, and therefore, the focal point can be adjusted at high speed.

Second Embodiment

<Layout in Sharing of FD by 3Tr. Type Pixels of 4×2>

Next, a layout in the case where an FD is shared by 3Tr. type pixels of 4×2 will be described with reference to FIG. 7. Note that in the layout of a solid-state image sensor of FIG. 7, the same names and the same reference numerals are used to represent equivalent elements in a configuration having the same functions as those of the configuration in the layout of the solid-state image sensor of FIG. 4, and description thereof will be optionally omitted.

Figure 7:
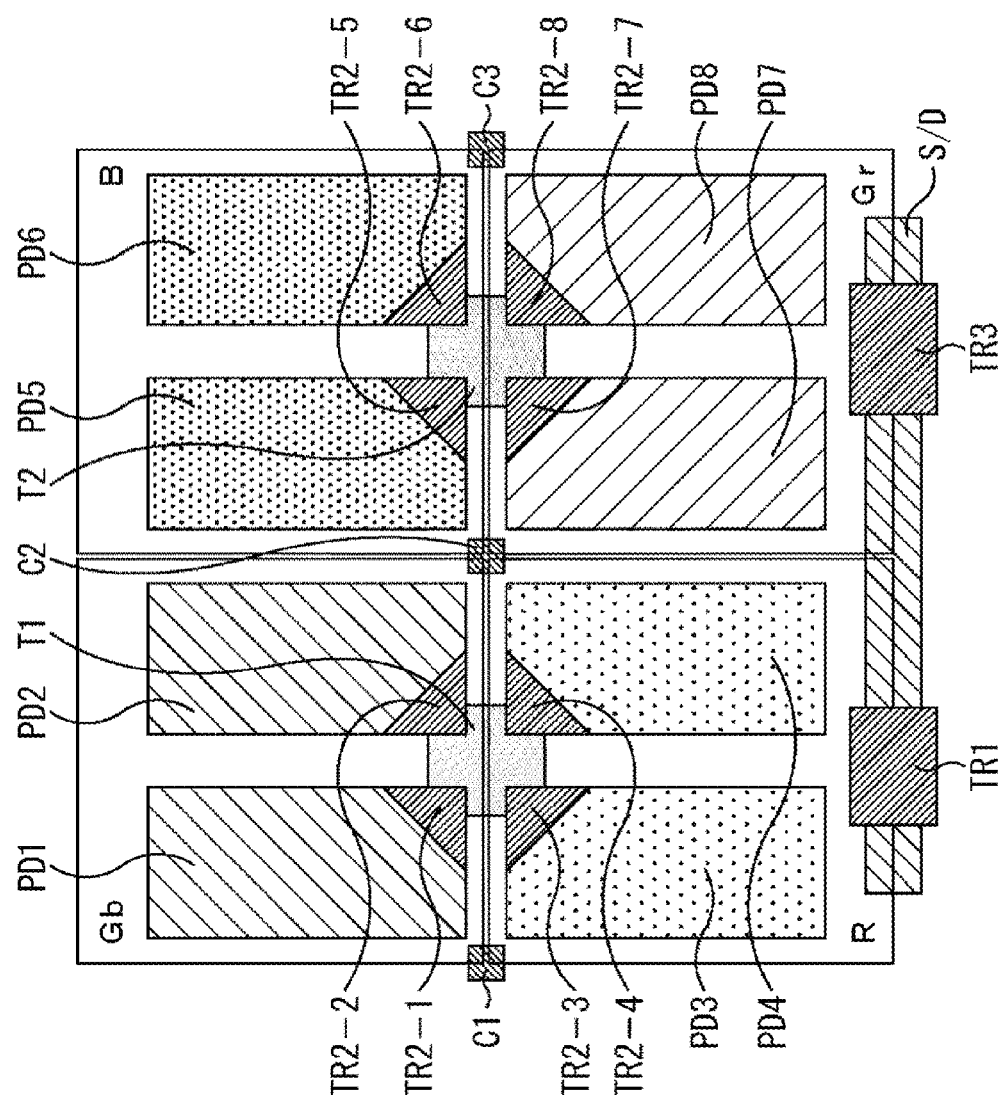
FIG. 7 is a view for describing the layout of a configuration example of a second embodiment of the solid-state image sensor to which the present technology is applied.

A circuit configuration of the 3Tr. type solid-state image sensor of FIG. 7 is different from the circuit configuration of the 4Tr. type solid-state image sensor in the presence or absence of a selection transistor TR14. Moreover, the reset transistor TR1, the transfer transistor TR2, and the amplification transistor TR3 in the 3Tr. type solid-state image sensor of FIG. 1 are the same as the reset transistor TR11, the transfer transistor TR12, and the amplification transistor TR13 in the 4Tr. type solid-state image sensor. Thus, each of transfer transistors TR2-1 to TR2-8 of PD 1 to PD 8 of FIG. 7 is the same as a corresponding one of the transfer transistors TR12-1 to TR12-8 of FIG. 4.

That is, in the case of the 3Tr. type solid-state image sensor of FIG. 7, each of a reset transistors TR1 and an amplification transistor TR3 is provided at the center of a lower end portion of a corresponding one of OCCFs for R, Gr to extend across an S/D (a source/drain) on the lower side as viewed in the figure. In the case of the 3Tr. type solid-state image sensor of FIG. 7, symmetry in component arrangement is higher than that in component arrangement of the 4Tr. type solid-state image sensor of FIG. 4. Thus, photo response non-uniformity can be further reduced.

Third Embodiment

<Layout in the Case of Providing Well Contacts Near Pixel Transistors in 4Tr. Type Solid-State Image Sensor>

Next, the layout of a solid-state image sensor in the case of providing well contacts near pixel transistors (a reset transistor TR1, TR11, an amplification transistor TR3, TR13, and a selection transistor TR14) will be described with reference to FIG. 8.

Figure 8:
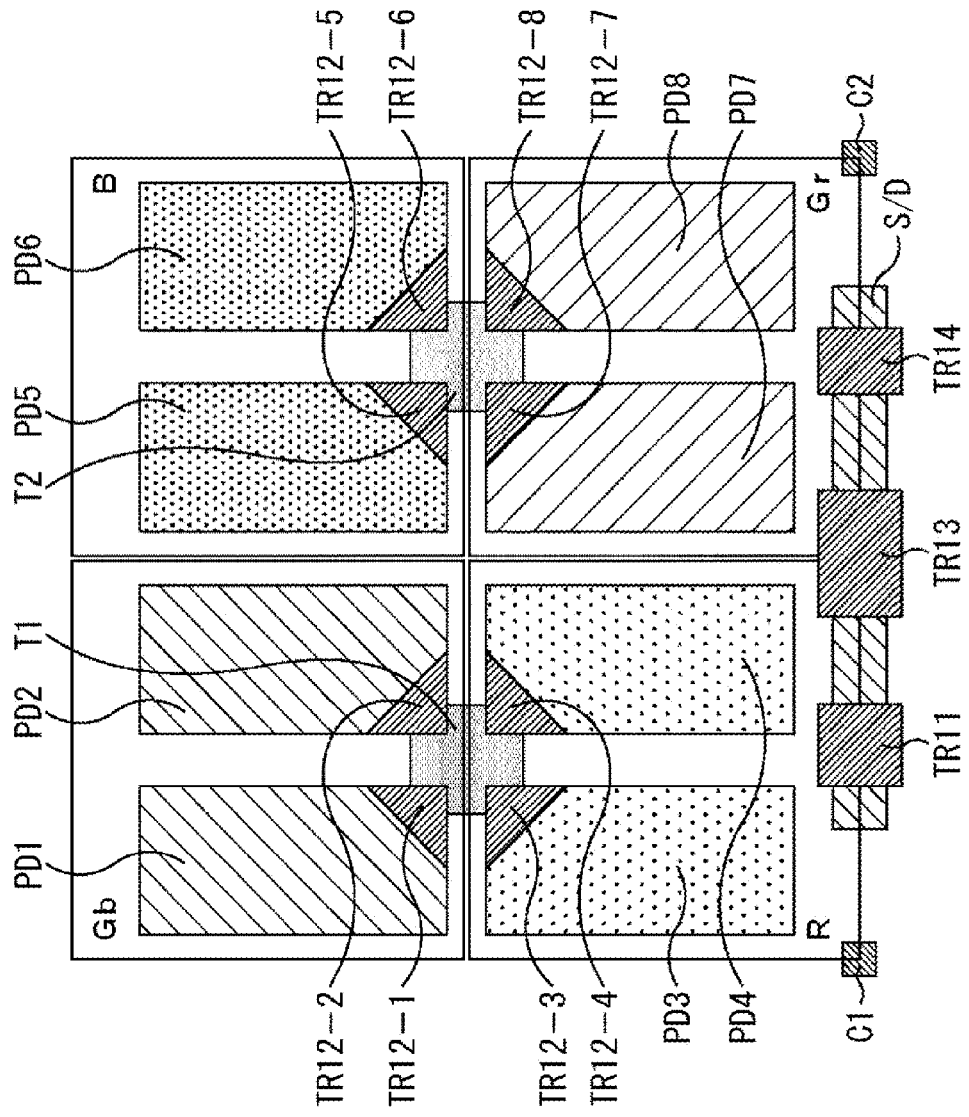
FIG. 8 is a view for describing the layout of a configuration example of a third embodiment of the solid-state image sensor to which the present technology is applied.

Note that in the layout of the solid-state image sensor of FIG. 8, the same names and the same reference numerals are used to represent equivalent elements in a configuration having the same functions as those of the configuration in the layout of the solid-state image sensor of FIG. 4, and description thereof will be optionally omitted.

That is, the layout of the solid-state image sensor of FIG. 8 is different from the layout of the solid-state image sensor of FIG. 4 in that the well contacts are not arranged to extend across the space where PD 1 to PD 8 are arranged, but are arranged near the reset transistor TR11, the amplification transistor TR13, and the selection transistor TR14.

That is, in FIG. 8, the reset transistor TR11, the amplification transistor TR13, and the selection transistor TR14 are provided between the well contacts C1, C2.

In the layout illustrated in FIG. 8, the PD 1 to PD 8 are not arranged between the well contacts C1, C2 in the horizontal direction. Thus, corrosion of the PD 1 to PD 8 due to diffusion in high-concentration p-type implantation can be prevented, and therefore, a loss in a saturation signal amount Qs can be avoided.

Moreover, since the well contacts C1, C2 are arranged apart from transfer transistors TR12-1 to TR12-8, the well contacts C1, C2 can be less susceptible to an intense electric field generated due to turning ON of the transfer transistors TR12-1 to TR12-8, and the risk of causing white spots due to such an intense electric field can be reduced.

Fourth Embodiment

<Layout in the Case of Providing Well Contacts Near Pixel Transistors in 3Tr. Type Solid-State Image Sensor>

The layout of providing the well contacts near the pixel transistors in the 4Tr. type solid-state image sensor has been described above, but well contacts may be provided near pixel transistors in a 3Tr. type solid-state image sensor.

Figure 9:
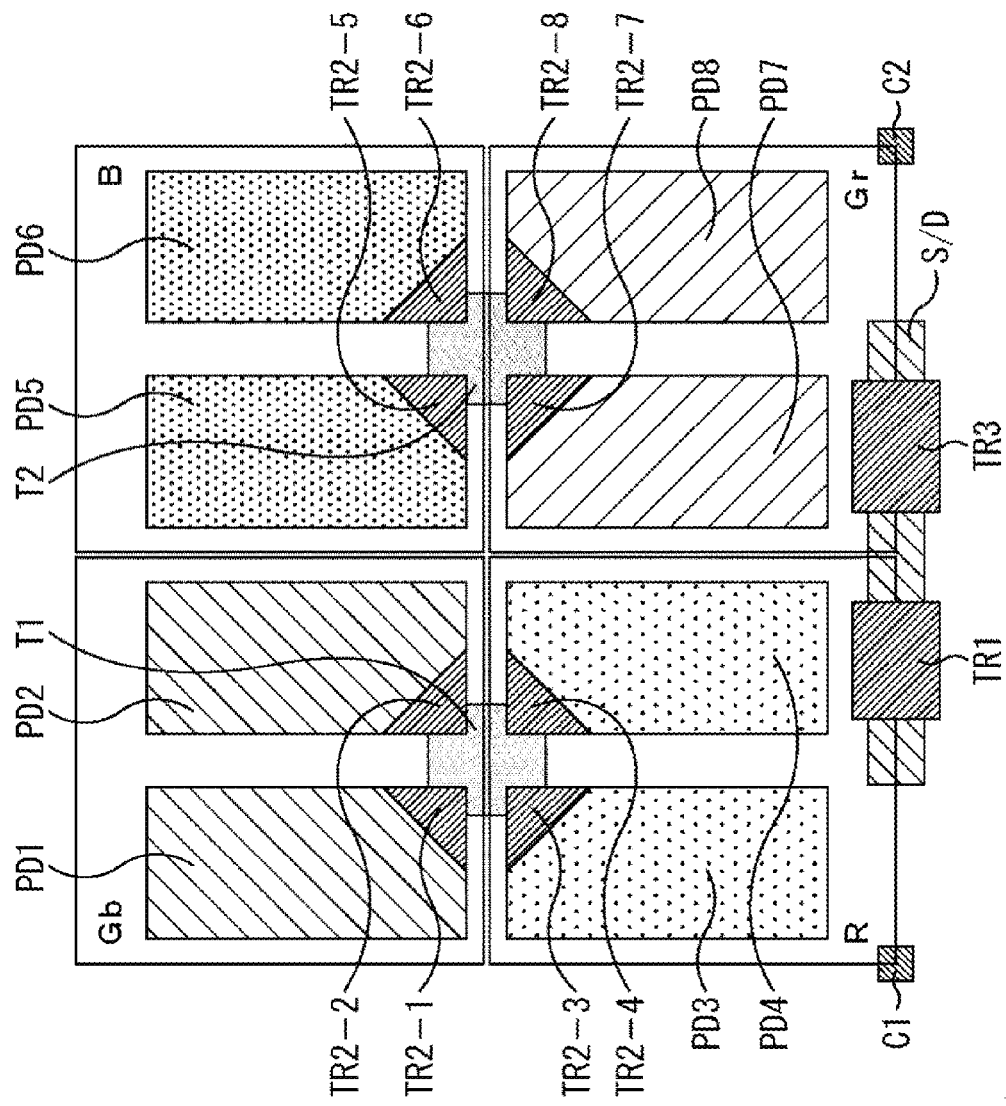
FIG. 9 is a view for describing the layout of a configuration example of a fourth embodiment of the solid-state image sensor to which the present technology is applied.

FIG. 9 illustrates the layout of providing the well contacts near the pixel transistors in the 3Tr. type solid-state image sensor. Note that in the layout of the solid-state image sensor of FIG. 9, the same names and the same reference numerals are used to represent equivalent elements in a configuration having the same functions as those of the configuration in the layout of the solid-state image sensor of FIG. 8, and description thereof will be optionally omitted.

That is, in the layout of the 3Tr. type solid-state image sensor of FIG. 9, the well contacts C1, C2 are also provided near a reset transistor TR1 and an amplification transistor TR3.

With such arrangement, reduction in a saturation signal amount Qs can be suppressed, and the risk of causing white spots can be reduced. Further, the width (the L length) of each pixel transistor in the horizontal direction as viewed in the figure can be ensured.

Fifth Embodiment

<Layout of Solid-State Image Sensor in Sharing of FD by 4Tr. Type Pixels of 2×4>

The example where the sharing unit for sharing the FD includes the total of eight pixels of 4×2, i.e., the total of eight pixels using the different OCCFs has been described above. However, other layout of a plurality of pixels forming a sharing unit than the above-described layout may be employed, and for example, the sharing unit for sharing an FD may include pixels of 2×4.

Figure 10:
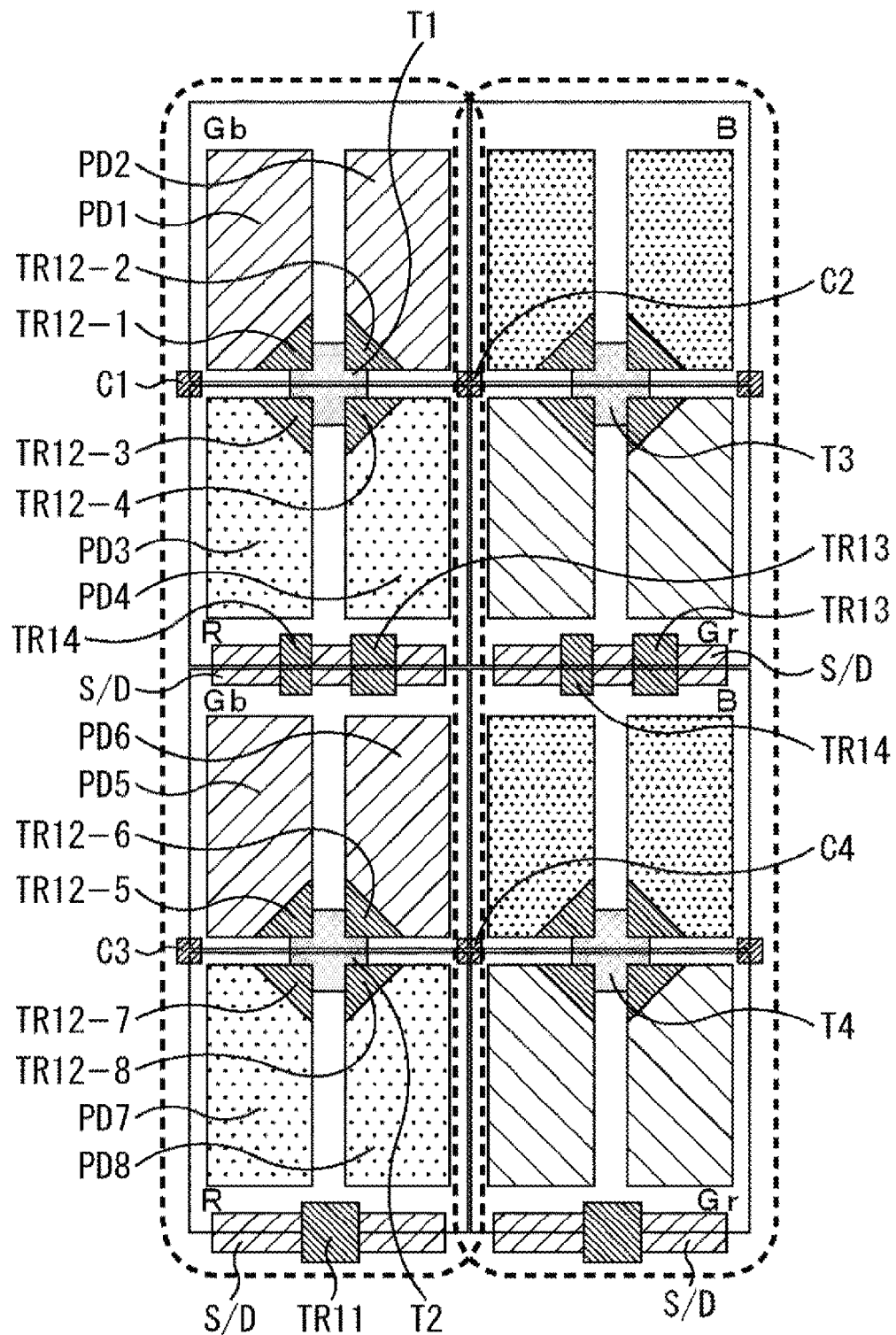
FIG. 10 is a view for describing the layout of a configuration example of a fifth embodiment of the solid-state image sensor to which the present technology is applied.

FIG. 10 illustrates the layout of a solid-state image sensor configured such that each sharing unit for sharing an FD includes pixels of 2×4.

For each on-chip color filter (OCCF) in the layout of the solid-state image sensor of FIG. 10, two PDs elongated in the vertical direction are, as in the case of the layout of the solid-state image sensor of FIG. 4, arranged in the horizontal direction, and these two PDs continuously arranged in the horizontal direction form a square region.

More specifically, of the OCCFs with a Bayer array of Gb, R, B, Gr provided in the order of the upper left side, the lower left side, the upper right side, the lower right side, the OCCFs for Gb, R arranged adjacent to each other in the vertical direction in the left column as viewed in the figure are repeated twice, and therefore, these four OCCFs in total form one of sharing units. Similarly, of the OCCFs with the Bayer array of Gb, R, B, Gr provided in the order of the upper side, the lower left side, the upper right side, the lower right side, the two OCCFs for B, Gr arranged adjacent to each other in the vertical direction in the right column as viewed in the figure are repeated twice in a column at the right of the column of the OCCFs for Gb, R, and therefore, these four OCCFs in total form the other sharing unit. Then, the column in which the one sharing unit repeatedly is arranged in the vertical direction and the column in which the other sharing unit repeatedly is arranged in the vertical direction are alternately arranged.

Further, for the OCCF for Gb in one of the sharing units, rectangular PD 1, PD 2 whose vertical length is longer than the horizontal length are provided. Similarly, the OCCF for R is provided with PD 3, PD 4, the second OCCF for Gb below the OCCF for R is provided with PD 5, PD 6, and another OCCF for R below the OCCF for second OCCF for Gb is provided with PD 7, PD 8.

That is, in FIG. 10, the common FD is provided for the total of eight pixels, each of the total of four OCCFs of one in the horizontal direction×four in the vertical direction being provided with two pixels arranged in the horizontal direction.

Further, transfer transistors TR12-1 to TR12-4 are provided respectively at the corners of the PD 1 to PD 4 such that the corners respectively contact the positions of a square FD (T1) facing the corners, the square FD being provided at a center position of the boundary between the upper OCCFs for Gb, R. Similarly, transfer transistors TR12-5 to TR12-8 are provided respectively at the corners of the PD 5 to PD 8 such that the corners respectively contact the positions of a square FD (T2) facing the corners, the square FD being provided at a center position of the boundary between the lower OCCFs for Gb, R.

Further, at the boundary between the upper OCCF for R and the lower OCCF for Gb, a selection transistor TR14 and an amplification transistor TR13 are, in this order from the left side, provided to extend across an S/D (a source/drain), the transistors TR14, TR13 being coupled to a line coupled to the common square FDs (T1, T2). Moreover, at the center of the boundary of the lower OCCF for R, a reset transistor TR11 is provided to extend across an S/D.

In addition, each of well contacts C1, C2, C3, C4 is provided at a corresponding one of the corners of the OCCFs at the boundaries between the upper OCCFs for Gb, R and between the lower OCCFs for Gb, R.

According to the configuration of the solid-state image sensor of FIG. 10, it is difficult to ensure a length in the horizontal direction as viewed in the figure, and therefore, it is difficult to reduce the influence of random noise. However, a conversion efficiency can be improved.

Moreover, in each sharing unit of the solid-state image sensor of FIG. 10, the same FD is shared by two OCCFs for the same color. Thus, FD addition is available for pixel signals of the pixels for the same color, and therefore, a dynamic range can be expanded. Further, as in the configuration of the solid-state image sensor of FIG. 5, drive lines for HDR driving can be easily arranged in a BEOL layout, and the influence of parasitic capacitance due to a capacitive coupling between the drive lines can be reduced.

Sixth Embodiment

<Layout of Solid-State Image Sensor Configured Such that FD is Shared by 4Tr. Type Pixels of 2×4 and Source/Drain is Shared by Adjacent Sharing Units>

The example configuration in which the source/drain (S/D) is independently provided for each sharing unit has been described above. In the case of the solid-state image sensor of FIG. 10, the horizontal distance is fixed in sharing by pixels of 2×4, and therefore, the degree of freedom in wiring of a plurality of vertical signal lines VSL is determined. Thus, in order to reduce random noise, an L length may be ensured by sharing of a drain of an amplification transistor TR13.

Figure 11:
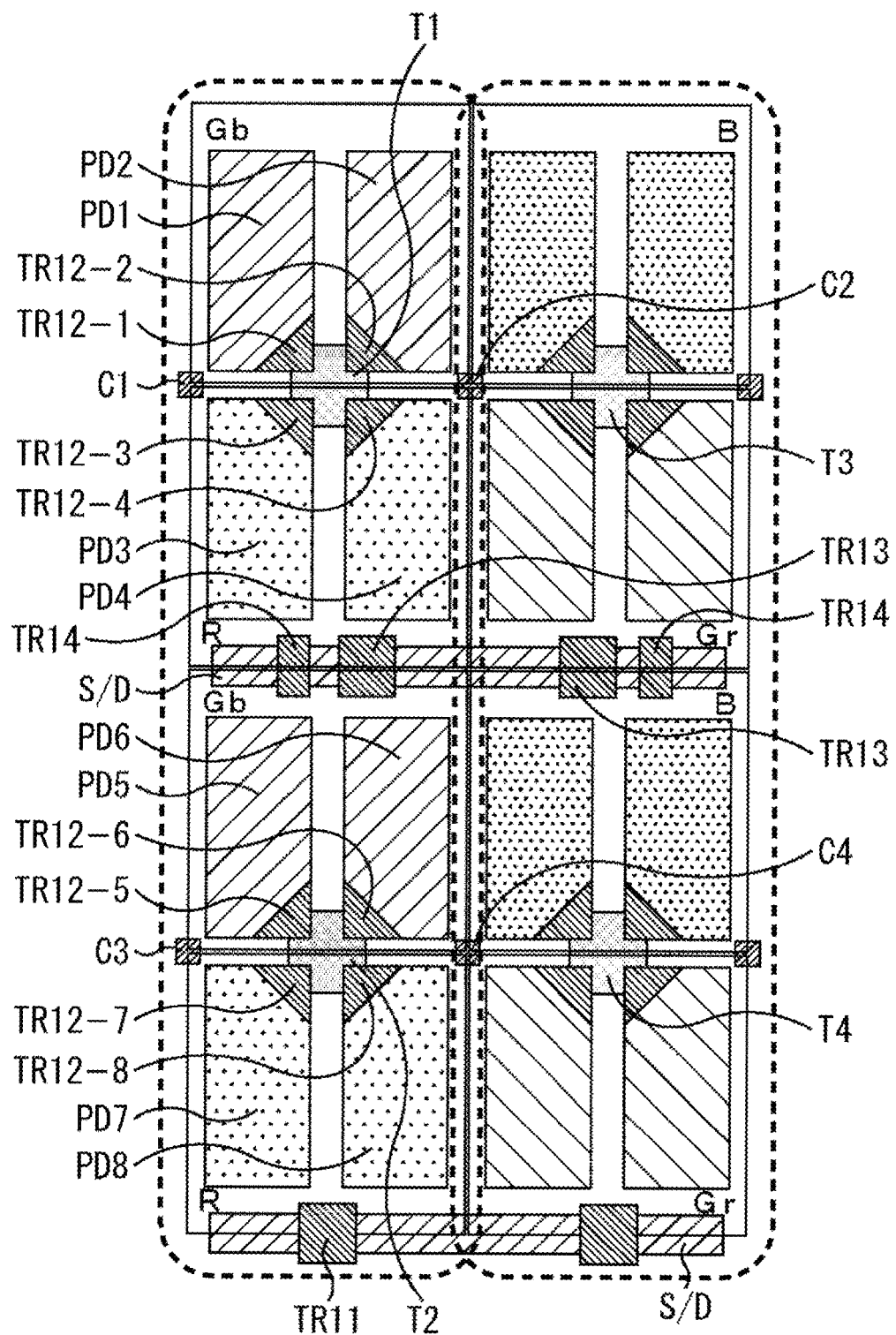
FIG. 11 is a view for describing the layout of a configuration example of a sixth embodiment of the solid-state image sensor to which the present technology is applied.

FIG. 11 illustrates the layout of a solid-state image sensor configured such that a source/drain (S/D) is shared by sharing units adjacent to each other in the horizontal direction. Note that in the layout of the solid-state image sensor of FIG. 11, the same names and the same reference numerals are used to represent equivalent elements in a configuration having the same functions as those of the configuration in the layout of the solid-state image sensor of FIG. 10, and description thereof will be optionally omitted.

That is, the layout of the solid-state image sensor of FIG. 11 is different from the layout of the solid-state image sensor of FIG. 10 in that the source/drain (S/D) is shared by the adjacent sharing units indicated by dashed lines. In association with sharing of the source/drain (S/D) by the adjacent sharing units, arrangement of an amplification transistor TR13 and a selection transistor TR14 in the right sharing unit as viewed in FIG. 11 is inverted to right and left in the case of FIG. 10.

As illustrated in the solid-state image sensor of FIG. 11, the source/drain (S/D) is shared by the sharing units adjacent to each other in the horizontal direction, and therefore, the L lengths of the selection transistor TR14 and the amplification transistor TR13 can be ensured.

Seventh Embodiment

<Layout of Solid-State Image Sensor Configured Such that FD is Shared by 4Tr. Type Pixels of 2×4 and Vertical Signal Line is Shared by Adjacent Sharing Units>

The layout in which the source/drain (S/D) is shared by adjacent sharing units has been described above, but a vertical signal line may be shared by sharing units adjacent to each other in the horizontal direction.

Figure 12:
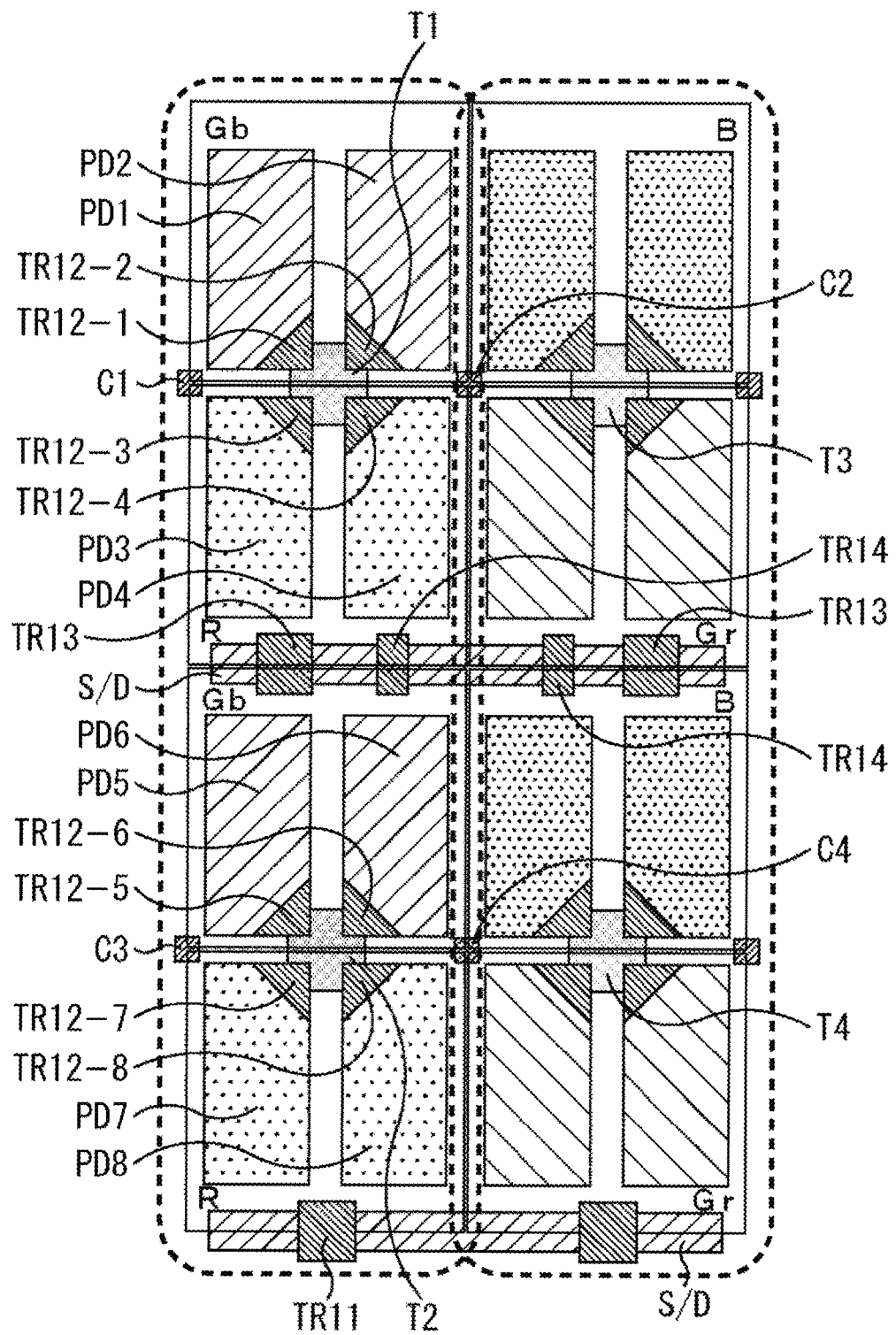
FIG. 12 is a view for describing the layout of a configuration example of a seventh embodiment of the solid-state image sensor to which the present technology is applied.

FIG. 12 illustrates the layout of a solid-state image sensor configured such that a vertical signal line is shared by sharing units adjacent to each other in the horizontal direction. Note that in the layout of the solid-state image sensor of FIG. 12, the same names and the same reference numerals are used to represent equivalent elements in a configuration having the same functions as those of the configuration in the layout of the solid-state image sensor of FIG. 11, and description thereof will be optionally omitted.

That is, in the layout of the solid-state image sensor of FIG. 12, a not-shown vertical signal line VSL is provided to vertically extend in the vicinity of a center position in the horizontal direction as viewed in the figure, and is shared by two adjacent sharing units. Thus, arrangement of the selection transistor TR14 and the amplification transistor TR13 in FIG. 11 is inverted to right and left in the sharing units of FIG. 12 so that the selection transistors TR14 of both sharing units can be easily coupled to the same vertical signal line VSL provided at the boundary between two sharing units of FIG. 12.

As in the case where the source/drain (S/D) is shared by the sharing units adjacent to each other in the horizontal direction, the vertical signal line VSL is further shared in the layout of the solid-state image sensor of FIG. 12, and therefore, the L lengths of the selection transistors TR14 and the amplification transistors TR13 can be ensured.

Eighth Embodiment

<Layout of Solid-State Image Sensor Provided with Reset Transistor and Dummy Transistor Thereof>

The example where the reset transistor TR11 is provided for the sharing unit including the total of eight pixels, i.e., the sharing unit in which the pixels of 2×4 in four OCCFs share the FD, has been described above. However, in order to improve symmetry in the horizontal direction and reduce photo response non-uniformity, a reset transistor TR11 may be provided on a source/drain (S/D) adjacent to a lower end portion of one of right and left PDs of a lowermost OCCF, and a dummy transistor having the same configuration as that of the reset transistor TR11 may be provided on the source/drain (S/D) adjacent to the other PD.

Figure 13:
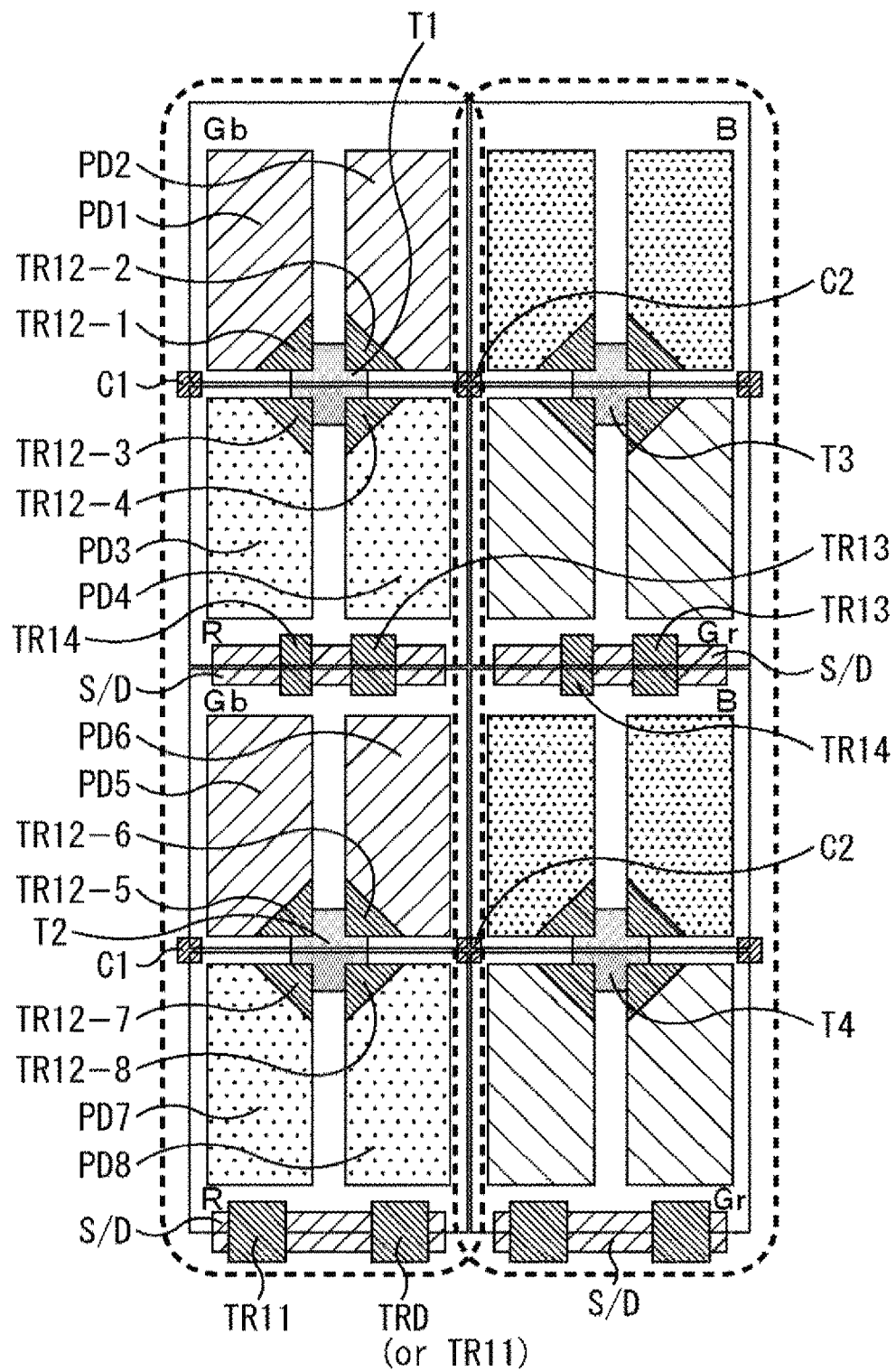
FIG. 13 is a view for describing the layout of a configuration example of an eighth embodiment of the solid-state image sensor to which the present technology is applied.

FIG. 13 illustrates the layout of a solid-state image sensor configured as follows: the reset transistor TR11 is, instead of the reset transistor TR11 of the solid-state image sensor of FIG. 10, provided on the source/drain (S/D) adjacent to a lower end portion of a PD 7 as one of the right and left PDs of the lowermost OCCF, and the reset transistor (the dummy transistor) TR11 having the same configuration as that of the reset transistor TR11 is provided on the source/drain (S/D) adjacent to a PD 8 as the other PD. As long as only one of the right and left transistors functions as the reset transistor TR11, the other transistor may be the same dummy transistor as the reset transistor TR11.

With such a layout, the horizontal symmetry of the pixels forming the sharing units can be improved, and photo response non-uniformity can be reduced. Note that even when the reset transistor TR11 of each of the solid-state image sensors of FIGS. 11 and 12 as described above includes two reset transistors TR11 (any of these transistors may be a dummy transistor) as illustrated in FIG. 13, similar advantageous effects can be provided.

Ninth Embodiment

<Layout of Solid-State Image Sensor in Sharing of FD by 3Tr. Type Pixels of 2×4>

The layout of the solid-state image sensor configured such that the FD is shared by the 4Tr. type pixels of 2×4 has been described above, but the FD may be shared by 3Tr. type pixels of 2×4.

Figure 14:
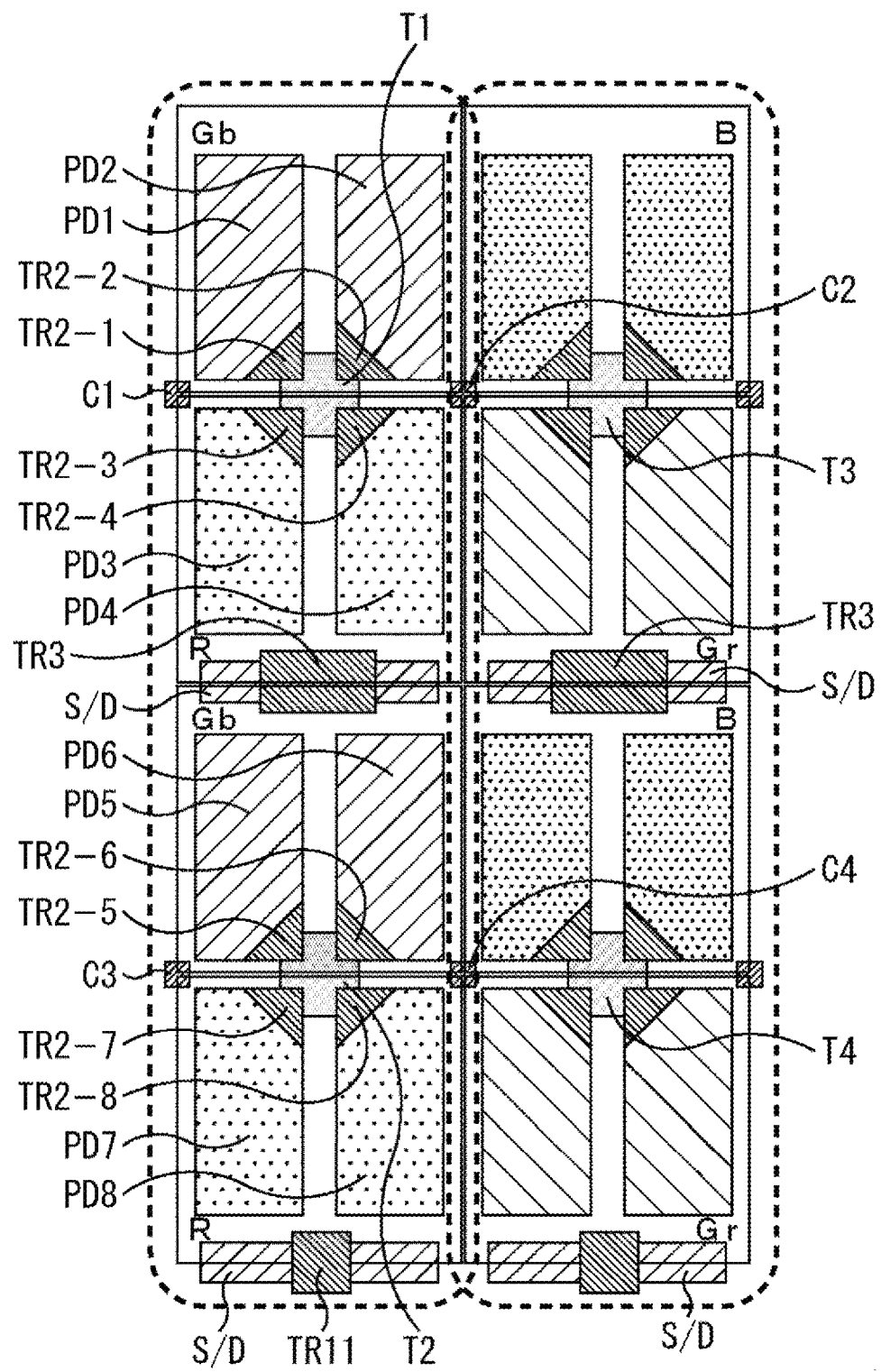
FIG. 14 is a view for describing the layout of a configuration example of a ninth embodiment of the solid-state image sensor to which the present technology is applied.

FIG. 14 illustrates the layout of a solid-state image sensor configured such that an FD is shared by 3Tr. type pixels of 2×4. Note that in the layout of the solid-state image sensor of FIG. 14, the same names and the same reference numerals are used to represent equivalent elements in a configuration having the same functions as those of the configuration in the layout of the solid-state image sensor of FIG. 10, and description thereof will be optionally omitted.

That is, the layout of the solid-state image sensor of FIG. 14 is different from the layout of the solid-state image sensor of FIG. 10 in that a reset transistor TR1, a transfer transistor TR2, and an amplification transistor TR3 are provided instead of the reset transistor TR11, the transfer transistor TR12, the amplification transistor TR13, and the selection transistor TR14.

Thus, each of transfer transistors TR2-1 to TR2-8 is provided at a corresponding position of PD 1 to PD 8, and the amplification transistor TR3 is, instead of the amplification transistor TR13 and the selection transistor TR14, provided at a center position of the boundary between an upper OCCF for R and a lower OCCF for Gb. Moreover, the reset transistor TR1 is provided instead of the reset transistor TR11.

According to the layout of the solid-state image sensor of FIG. 14, the L length of the amplification transistor TR3 can be easily ensured, and therefore, worsening of random noise can be suppressed. Further, the positions of well contacts C1 to C4 are changeable as in the layout of the solid-state image sensors described with reference to FIGS. 4 and 7, and are not limited to arrangement in the solid-state image sensors of FIGS. 10 and 11.

Tenth Embodiment

<Layout of Solid-State Image Sensor in Sharing of FD by 4Tr. Type Pixels of 8×1>

The example where the sharing unit for sharing the FD includes the total of eight pixels of the different OCCFs, i.e., the total of four OCCFs of 1×4, has been described above. However, the layout of the plurality of pixels forming the sharing unit may be other layout than above, and for example, the sharing unit for sharing an FD may include pixels of 8×1.

Figure 15:
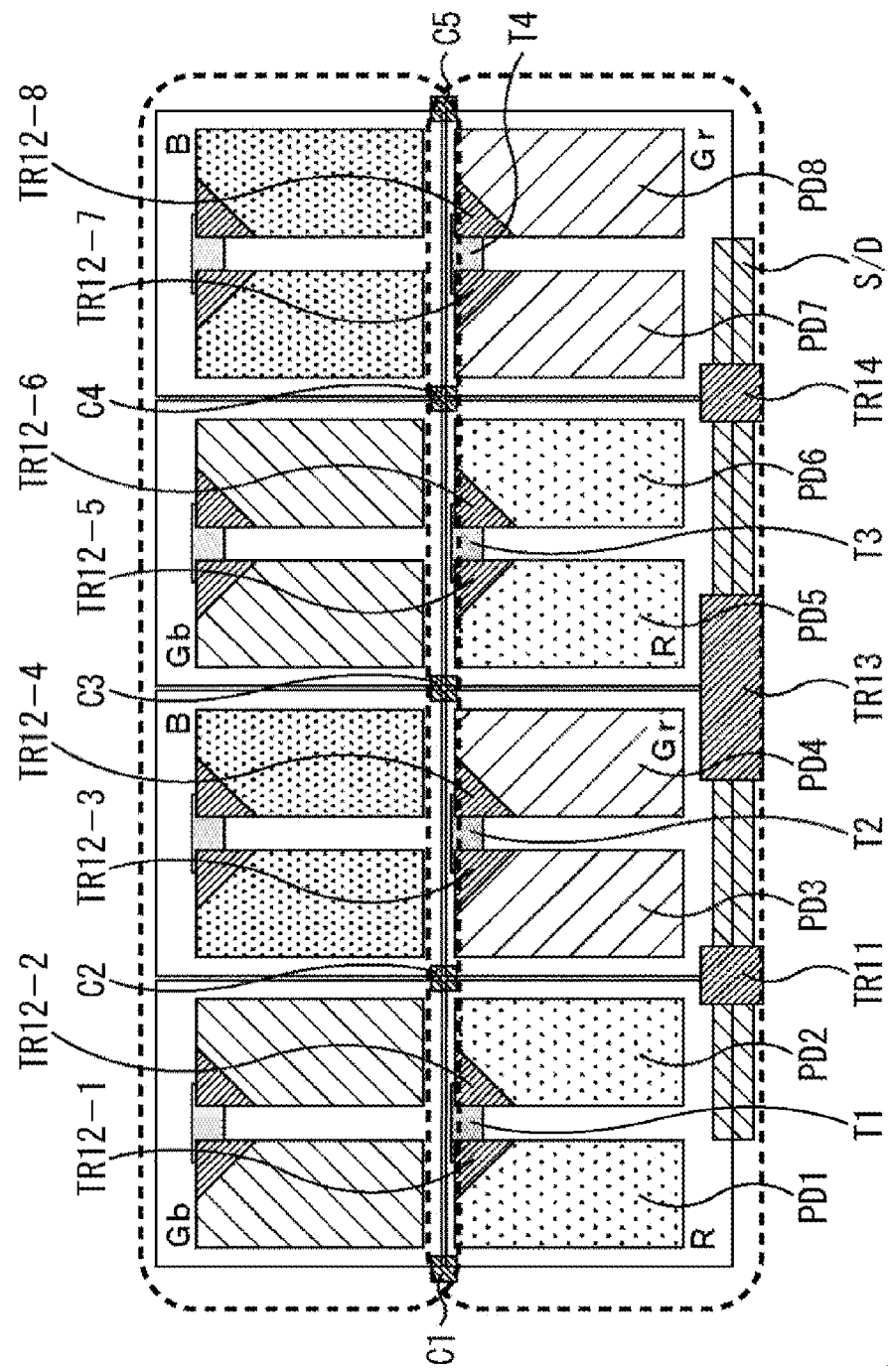
FIG. 15 is a view for describing the layout of a configuration example of a tenth embodiment of the solid-state image sensor to which the present technology is applied.

FIG. 15 illustrates the layout of a solid-state image sensor configured such that the sharing unit for sharing the FD includes the pixels of 8×1.

As in the case of the solid-state image sensor of FIG. 4, two PDs elongated in the vertical direction are, for each on-chip color filter (OCCF), arranged in the horizontal direction in FIG. 15, and these two PDs continuously arranged in the horizontal direction form a square region.

More specifically, of the OCCFs with a Bayer array of Gb, R, B, Gr provided in this order of the upper left side, the lower left side, the upper right side, the lower right side as viewed in FIG. 15, the OCCFs for R, Gr arranged adjacent to each other in the horizontal direction in the lower row as viewed in the figure are repeated twice, and therefore, these four OCCFs in total form one of sharing units. Similarly, of the OCCFs with the Bayer array of Gb, R, B, Gr provided in this order from the left side to the right side, the OCCFs for Gb, B arranged adjacent to each other in the horizontal direction in the upper row as viewed in the figure are repeated twice in a row above the row of the OCCFs for R, Gr, and therefore, these four OCCFs in total form the other sharing unit. Then, the row in which the one sharing unit is repeatedly arranged in the horizontal direction and the row in which the other sharing unit is repeatedly arranged in the horizontal direction are alternately arranged.

For the OCCF for R on the left side in one of the sharing units, rectangular PD 1, PD 2 whose vertical length is longer than the horizontal length are provided. Similarly, the OCCF for Gr on the right side of the OCCF for R is provided with PD 3, PD 4, another OCCF for R on the right side of the OCCF for Gr is provided with PD 5, PD 6, and another OCCF for Gr at the right end of the sharing unit is provided with PD 7, PD 8.

That is, in FIG. 15, a common FD is provided for the total of eight pixels, each of the total of four OCCFs of four in the horizontal direction×one in the vertical direction being provided with two pixels arranged in the horizontal direction.

Further, transfer transistors TR12-1, TR12-2 are provided respectively at the corners of the PD 1, PD 2 such that the corners respectively contact end portions of a square FD (T1) in the horizontal direction, the square FD being provided at a center position of the boundary of an upper end of each OCCF for R, Gr, R, Gr. Further, transfer transistors TR12-3, TR12-4 are provided respectively at the corners of the PD 3, PD 4 such that the corners respectively contact end portions of a square FD (T2). Further, transfer transistors TR12-5, TR12-6 are provided respectively at the corners of the PD 5, PD 6 such that the corners respectively contact end portions of a square FD (T3). In addition, transfer transistors TR12-7, TR12-8 are provided respectively at the corners of the PDs 7, 8 such that the corners respectively contact end portions of a square FD (T4). Moreover, the terminals T1 to T4 are coupled to the same FD through the same line, and therefore, the same FD is shared by the PD 1 to PD 8.

Further, at the lower end of the sharing unit at the boundary between adjacent right and left ones of the OCCFs for R, Gr, R, Gr, a reset transistor TR11, an amplification transistor TR13, and a selection transistor TR14 are, in this order from the left side, provided to extend across an S/D (a source/drain) such that the transistors TR11, TR13, TR14 are coupled to the line coupled to the FD together with the common terminals T1 to T4.

Further, well contacts C1 to C5 are provided at the upper end corners of the OCCFs for R, Gr, R, Gr at the boundary between adjacent right and left ones of these OCCFs.

According to the layout of the solid-state image sensor of FIG. 15, a length in the horizontal direction as viewed in the figure can be easily ensured, and therefore, the L lengths of the reset transistor TR11, the amplification transistor TR13, and the selection transistor TR14 can be easily increased. Thus, worsening of random noise can be suppressed.

Moreover, in each sharing unit of the layout of the solid-state image sensor of FIG. 15, the same FD is shared by two OCCFs for the same color. Thus, FD addition is available for pixel signals of the pixels for the same color, and therefore, a dynamic range can be expanded. Further, in the case of providing a plurality of vertical signal lines VSL in a BEOL layout, a sufficient space in the horizontal direction is ensured, and therefore, interference due to a capacitive coupling between adjacent ones of the vertical signal lines VSL can be reduced.

Eleventh Embodiment

<Layout of Solid-State Image Sensor Configured Such that FD is Shared by 4Tr. Type Pixels of 8×1 and Dummy Transistor is Provided>

The example where the reset transistor TR11, the amplification transistor TR13, and the selection transistor TR14 are provided at the horizontal boundary of the lower ends of four OCCFs in the sharing unit including the pixels of 8×1 has been described above. However, a dummy transistor having similar configuration to that of any of the reset transistor TR11, the amplification transistor TR13, and the selection transistor TR14 and not functioning as a transistor may be added, and a transistor may be formed at a lower end of each of four OCCFs. In this manner, symmetry may be improved.

Figure 16:
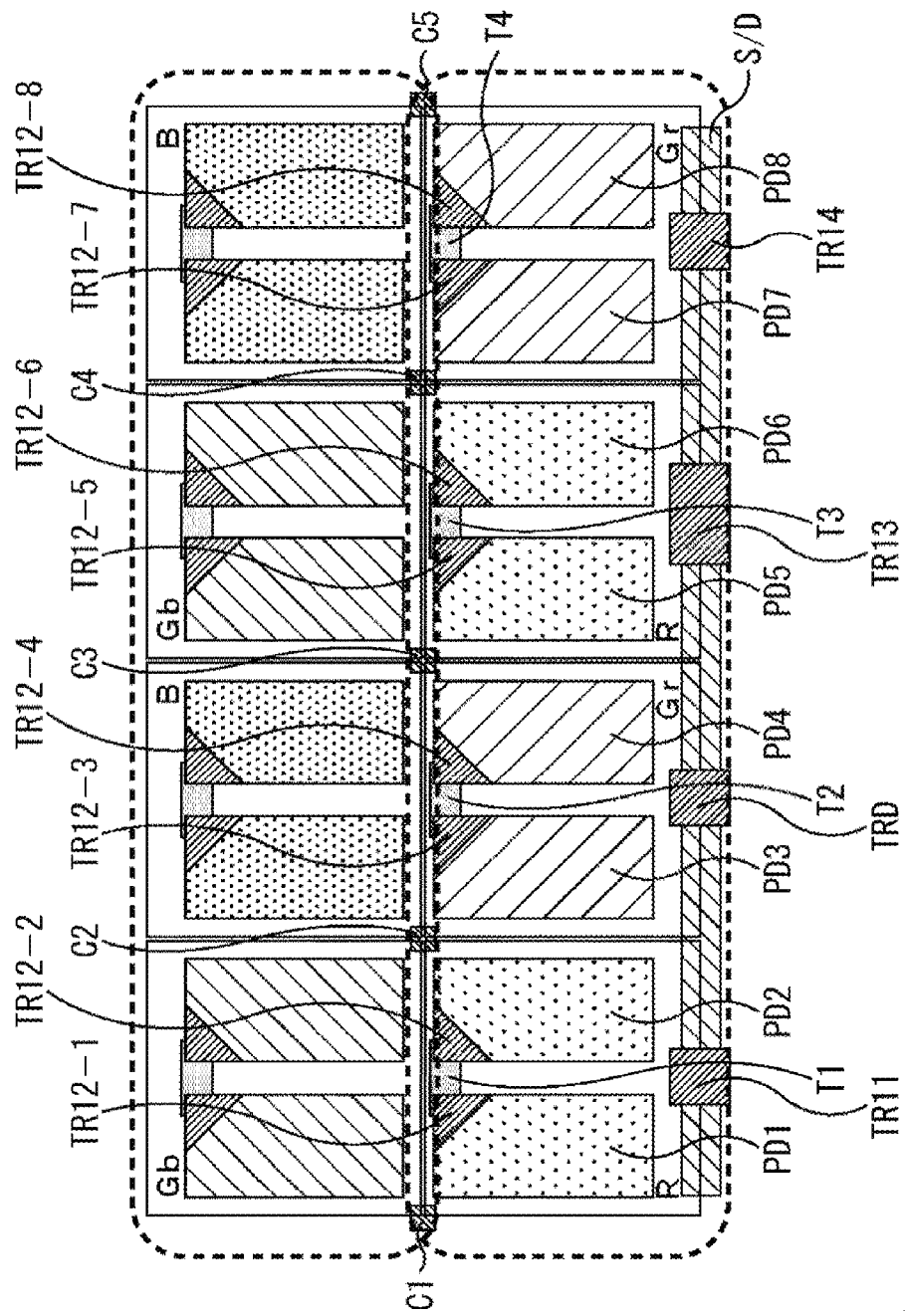
FIG. 16 is a view for describing the layout of a configuration example of an eleventh embodiment of the solid-state image sensor to which the present technology is applied.

In the layout of a solid-state image sensor of FIG. 16, the same dummy transistor as any of the reset transistor TR11, the amplification transistor TR13, and the selection transistor TR14 in the layout of the solid-state image sensor of FIG. 15 may be provided in addition to these transistors of FIG. 15 to improve symmetry in transistor arrangement.

More specifically, the solid-state image sensor of FIG. 16 is configured such that the reset transistor TR11, the dummy transistor TRD, the amplification transistor TR13, and the selection transistor TR14 are provided respectively at the centers of lower ends of OCCFs for R, Gr, R, Gr.

With such a configuration, symmetry in the horizontal direction can be improved, and photo response non-uniformity can be improved.

Twelfth Embodiment

<Layout of Solid-State Image Sensor in Sharing of FD by 3Tr. Type Pixels of 8×1>

The layout of the solid-state image sensor employing the sharing unit including the 4Tr. type pixels of 8×1 has been described above, but a 3Tr. type solid-state image sensor may be employed instead of the 4Tr. type solid-state image sensor.

Figure 17:
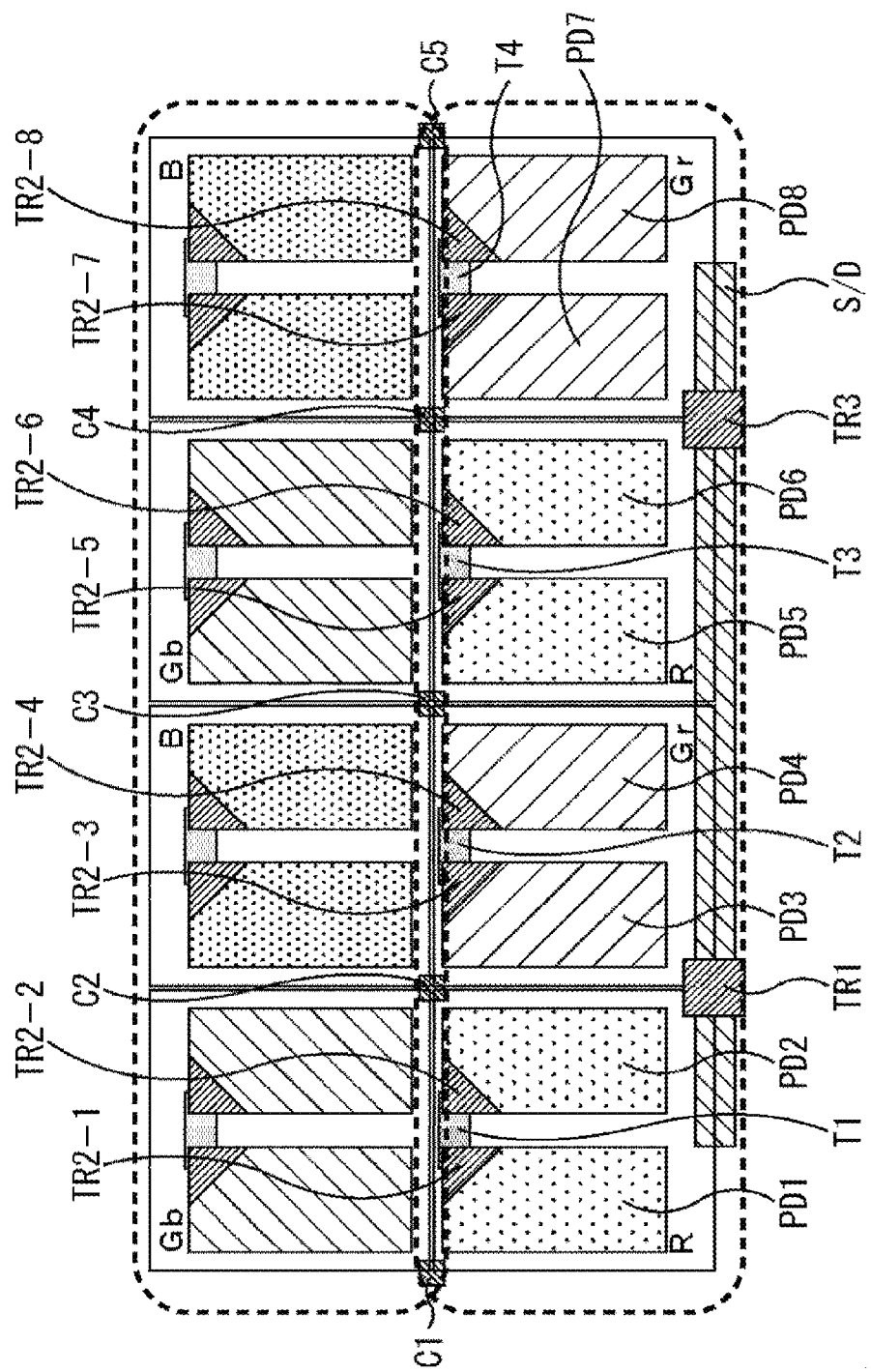
FIG. 17 is a view for describing the layout of a configuration example of a twelfth embodiment of the solid-state image sensor to which the present technology is applied.

FIG. 17 illustrates the layout of the 3Tr. type solid-state image sensor employing a sharing unit including pixels of 8×1. Note that in the layout of the solid-state image sensor of FIG. 17, the same names and the same reference numerals are used to represent equivalent elements in a configuration having the same functions as those of the configuration in the layout of the solid-state image sensor of FIG. 16, and description thereof will be optionally omitted.

That is, the layout of the solid-state image sensor of FIG. 17 is different from the layout of the solid-state image sensor of FIG. 16 in the following points: transfer transistors TR2-1 to TR2-8 are provided instead of the transfer transistors TR12-1 to TR12-8 provided respectively at the PD 1 to PD 8; and a reset transistor TR1 and an amplification transistor TR3 are, in this order from the left side, provided to extend across an S/D, each transistor being provided at OCCF lower ends at the boundary between two horizontally-arranged OCCFs for R, Gr included in four OCCFs for R, Gr, R, Gr arranged in the horizontal direction to form a sharing unit.

According to the configuration of the solid-state image sensor of FIG. 17, the L lengths of the reset transistor TR1 and the amplification transistor TR3 can be easily ensured, and worsening of random noise can be suppressed.

Thirteenth Embodiment

<Layout of Solid-State Image Sensor in Sharing of FD by Other Pixel Number than Eight Pixels>

The solid-state image sensor configured such that the FD is shared by the sharing unit including eight pixels of the different OCCFs has been described above. However, the solid-state image sensor may be configured such that an FD is shared by other pixel number than above, such pixels forming different OCCFs.

Figure 18:
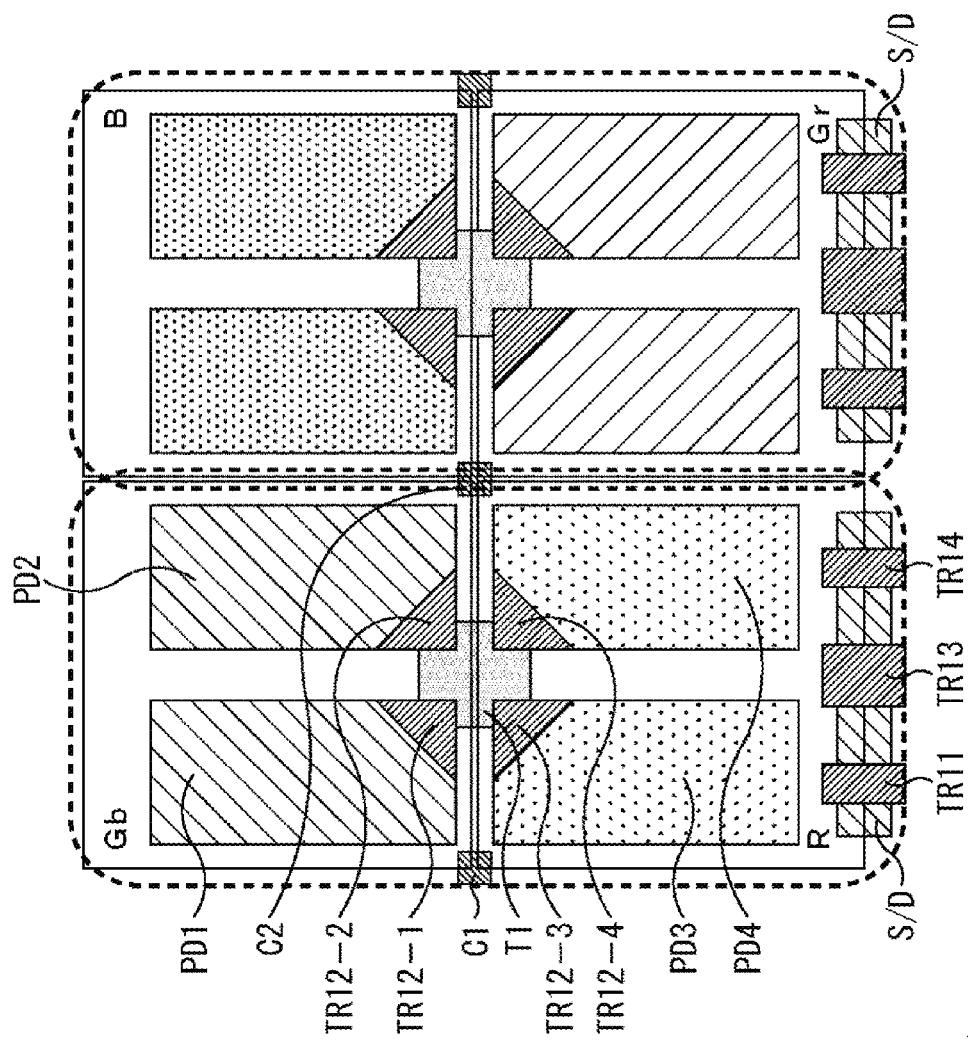
FIG. 18 is a view for describing the layout of a configuration example of a thirteenth embodiment of the solid-state image sensor to which the present technology is applied.

For example, a solid-state image sensor configured such that a sharing unit for sharing an FD by the total of four pixels, i.e., 4Tr. type pixels of 2×2, may have a layout as illustrated in FIG. 18.

More specifically, in the layout of the solid-state image sensor of FIG. 18, two OCCFs arranged for Gb, R of a Bayer array in this order from the upper side to the lower side in the vertical direction form one of sharing units. Similarly, two OCCFs arranged for B, Gr of the Bayer array in the order from the upper side to the lower side in the vertical direction forms the other sharing unit in a column next to the column of the OCCFs for Gb, R. Then, the column in which the one sharing unit repeatedly is arranged in the vertical direction and the column in which the other sharing unit repeatedly is arranged in the vertical direction are alternately arranged.

For the OCCF for Gb in one of the sharing units, rectangular PD 1, PD 2 whose vertical length is longer than the horizontal length are provided. Similarly, the OCCF for R is provided with PD 3, PD 4.

That is, in FIG. 18, a common FD is provided for the total of four pixels, each of the total of two OCCFs of one in the horizontal direction×two in the vertical direction being provided with two pixels arranged in the horizontal direction.

Further, transfer transistors TR12-1 to TR12-4 are provided respectively at the corners of the PD 1 to PD 4 such that the corners respectively contact the positions of a square FD (T1) facing the corners, the square FD being provided at a center position of the boundary between the upper OCCF for Gb and the lower OCCF for R.

Further, at a lower end of the OCCF for R, a reset transistor TR11, an amplification transistor TR13 and a selection transistor TR14 are, in this order from the left side, provided to extend across an S/D (a source/drain) such that the transistors TR11, TR13 and TR14 are coupled to a line coupled to the common square FD (T1).

Well contacts C1, C2 are provided respectively at the corners of the OCCFs for Gb, R at the boundary between these OCCFs.

According to the layout of the solid-state image sensor of FIG. 18, it is difficult to ensure a length in the horizontal direction as viewed in the figure, and for this reason, it is difficult to reduce the influence of random noise. However, a conversion efficiency can be improved.

Further, drive lines for HDR driving can be easily arranged in a BEOL layout, and the influence of parasitic capacitance due to a capacitive coupling between adjacent ones of the drive lines can be reduced.

Note that the number of pixels sharing the FD may be other number than above. For example, such a number may be eight or four pixels, and the sharing unit may include eight or four pixels of four OCCFs arranged longer in the vertical or horizontal direction.

The example where the FD is shared by the sharing unit including the plurality of pixels of the different on-chip color filters (OCCFs) in the configuration of arranging the plurality of pixels in the same OCCF has been described above. However, an FD may be shared by a sharing unit including a plurality of pixels of different on-chip lenses (OCLs) in the configuration of arranging a plurality of pixels in the same OCL. Alternatively, the configuration may be employed, in which an OCCF and an OCL are stacked on each other.

<Examples of Application to Electronic Equipment>

Each of the above-described solid-state image sensors is applicable to various types of electronic equipment including imaging devices such as digital still cameras and digital video cameras, portable phones having an imaging function, and other types of equipment having an imaging function, for example.

Figure 19:
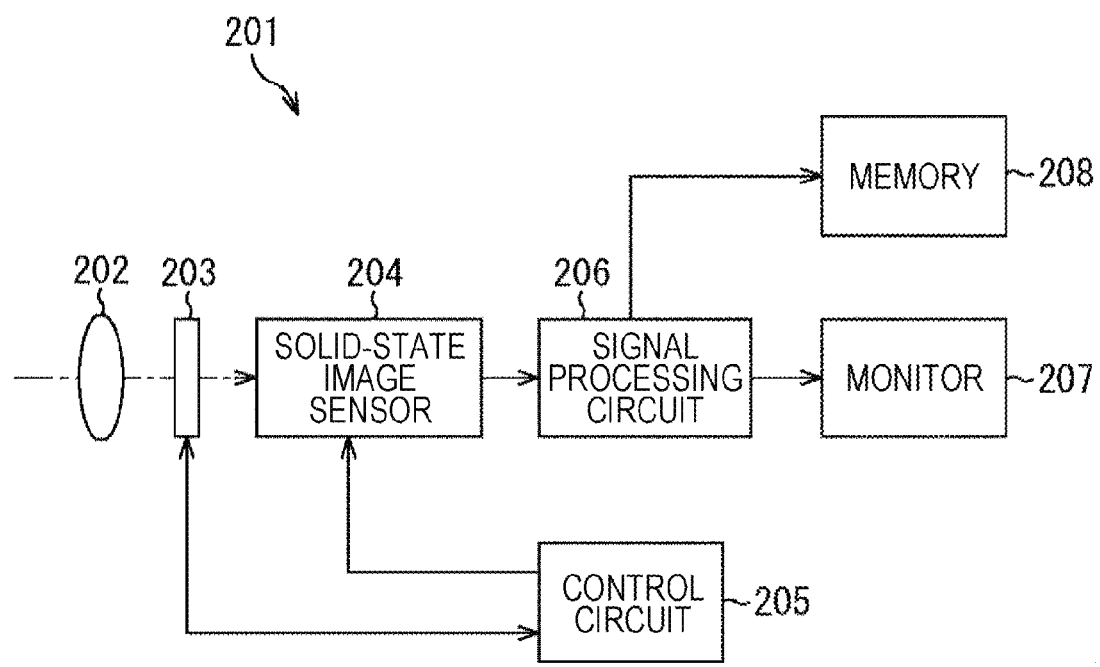
FIG. 19 is a diagram for describing the configuration of an imaging device and electronic equipment using the solid-state image sensor to which the present technology is applied.

FIG. 19 is a block diagram of a configuration example of an imaging device as electronic equipment to which the present technology is applied.

The imaging device 201 illustrated in FIG. 19 includes an optical system. 202, a shutter device 203, a solid-state image sensor 204, a control circuit 205, a signal processing circuit 206, a monitor 207, and a memory 208. The imaging device 201 is configured to acquire a still image and a video image.

The optical system 202 includes a lens or a plurality of lenses, and is configured to guide light (incident light) from an object to the solid-state image sensor 204 to form an image on a light receiving surface of the solid-state image sensor 204.

The shutter device 203 is disposed between the optical system 202 and the solid-state image sensor 204, and is configured to control a light irradiation period and a light shielding period for the solid-state image sensor 204 according to control of the control circuit 205.

The solid-state image sensor 204 includes a package with the above-described solid-state image sensor. The solid-state image sensor 204 is configured to accumulate, for a certain period, signal charge according to the light used to form the image on the light receiving surface via the optical system 202 and the shutter device 203. The signal charge accumulated in the solid-state image sensor 204 is transferred according to a drive signal (a timing signal) supplied from the control circuit 205.

The control circuit 205 is configured to output the drive signal for controlling transfer operation of the solid-state image sensor 204 and shutter operation of the shutter device 203 to drive the solid-state image sensor 204 and the shutter device 203.

The signal processing circuit 206 is configured to perform various types of signal processing for the signal charge output from the solid-state image sensor 204. An image (image data) obtained by the signal processing of the signal processing circuit 206 is supplied and displayed on the monitor 207, or is supplied and stored (recorded) in the memory 208.

Even in the imaging device 201 configured as described above, the above-described solid-state image sensor is, instead of the solid-state image sensor 204, applicable to realize imaging with low noise across all pixels.

<Use Examples of Solid-State Image Sensor>

FIG. 20 is a diagram of use examples of each of the above-described solid-state image sensors.

Each of the above-described solid-state image sensors can be used as follows in various cases of sensing light such as visible light, infrared light, ultraviolet light, and X-rays:

The device configured to shoot an image for entertainment, such as digital cameras and portable devices with a camera function;

the device for transportation for the purpose of, e.g., safe driving such as automatic stop and driver's state recognition, such as in-vehicle sensors configured to shoot, e.g., images of the front, back, periphery, and inside of an automobile, monitoring cameras configured to monitor a running vehicle and a road, and distance measurement sensors configured to measure, e.g., the distance between vehicles;

the device for home appliances such as TV sets, refrigerators, and air-conditioners for the purpose of shooting images of user's gestures to perform equipment operation according to such gestures;

the device for medical treatment and health care, such as endoscopes and the devices configured to shoot images of blood vessels by receiving of infrared light;

the device for security, such as surveillance cameras for crime prevention and cameras for personal authentication;

the device for beauty care, such as a skin checker configured to shoot an image of the skin and microscopes configured to shoot an image of the scalp;

the device for sports, such as action cameras and wearable cameras for the purpose of, e.g., sports; and the device for agriculture, such as cameras configured to monitor the state of a field and crops.

Note that the present technology may have the following configurations.

(1) A solid-state image sensor including:
at least either of on-chip color filters (OCCFs) configured to extract light having a predetermined wavelength from incident light or on-chip lenses (OCLs) configured to collect the incident light;
photo diodes configured to use, as incident light, at least either of the light having the predetermined wavelength and extracted by the OCCFs or the light collected by the OCLs to generate, for each pixel unit, charge corresponding to an amount of the incident light by a photoelectric effect; and
a floating diffusion (FD) configured to accumulate the charge generated by the photo diodes to apply voltage corresponding to the accumulated charge to a gate of an amplification transistor, wherein, in a configuration in which a plurality of pixels are arranged with respect to at least either of one of the OCCFs or one of the OCLs, the FD is shared by a sharing unit including a plurality of pixels, the plurality of pixels including pixels of at least either of different OCCFs or different OCLs.

(2) The solid-state image sensor according to (1), wherein the photo diodes of two pixels are arranged with respect to at least either of one of the OCCFs or one of the OCLs.

(3) The solid-state image sensor according to (1) or (2), wherein
the sharing unit includes the pixels corresponding to at least either of the OCCFs or the OCLs adjacent to each other in a horizontal direction.

(4) The solid-state image sensor according to (3), wherein
the sharing unit includes the pixels corresponding to at least any ones of two OCCFs, four OCCFs, two OCLs, and four OCLs adjacent to each other in the horizontal direction.

(5) The solid-state image sensor according to (1) or (2), wherein
the sharing unit includes the pixels corresponding to at least either of the OCCFs or the OCLs adjacent to each other in a vertical direction.

(6) The solid-state image sensor according to (5), wherein
the sharing unit includes the pixels corresponding to at least any ones of two OCCFs, four OCCFs, two OCLs, and four OCLs adjacent to each other in the vertical direction.

(7) The solid-state image sensor according to (1) or (2), wherein
the sharing unit includes the pixels corresponding to at least either of the OCCFs or the OCLs adjacent to each other in horizontal and vertical directions.

(8) The solid-state image sensor according to (7), wherein
the sharing unit includes the pixels corresponding to at least either of the OCCFs or the OCLs adjacent to each other such that there are two OCCFs or two OCLs in the horizontal direction and two OCCFs or two OCLs in the vertical direction.

(9) The solid-state image sensor according to any of (1) to (8), wherein
the sharing unit includes the pixels corresponding to at least either of the OCCFs or the OCLs extracting light having an identical wavelength.

(10) The solid-state image sensor according to any of (1) to (9), further including:
a reset transistor;
a transfer transistor; and
the amplification transistor.

(11) The solid-state image sensor according to any of (1) to (10), further including:
a reset transistor;
a transfer transistor;
the amplification transistor;
a selection transistor.

(12) The solid-state image sensor according to (11), wherein
a dummy transistor is disposed at such a position that arrangement intervals with respect to the reset transistor, the amplification transistor, and the selection transistor are in symmetrical positions in an arrangement direction of the reset transistor, the amplification transistor, and the selection transistor.

(13) The solid-state image sensor according to any of (1) to (12), further including:
a vertical signal line configured to transfer a pixel signal output from the amplification transistor,
wherein the vertical signal line is shared by the sharing units.

(14) The solid-state image sensor according to any of (1) to (13), wherein
a source/drain is shared by the sharing units.
(15) An imaging device including:
at least either of on-chip color filters (OCCFs) configured to extract light having a predetermined wavelength from incident light or on-chip lenses (OCLs) configured to collect the incident light;
photo diodes configured to use, as incident light, at least either of the light having the predetermined wavelength and extracted by the OCCFs or the light collected by the OCLs to generate, for each pixel unit, charge corresponding to an amount of the incident light by a photoelectric effect; and
a floating diffusion (FD) configured to accumulate the charge generated by the photo diodes to apply voltage corresponding to the accumulated charge to a gate of an amplification transistor,
wherein, in a configuration in which a plurality of pixels are arranged with respect to at least either of one of the OCCFs or one of the OCLs, the FD is shared by a sharing unit including a plurality of pixels, the plurality of pixels including pixels of at least either of different OCCFs or different OCLs.
(16) Electronic equipment including:
at least either of on-chip color filters (OCCFs) configured to extract light having a predetermined wavelength from incident light or on-chip lenses (OCLs) configured to collect the incident light;
photo diodes configured to use, as incident light, at least either of the light having the predetermined wavelength and extracted by the OCCFs or the light collected by the OCLs to generate, for each pixel unit, charge corresponding to an amount of the incident light by a photoelectric effect; and
a floating diffusion (FD) configured to accumulate the charge generated by the photo diodes to apply voltage corresponding to the accumulated charge to a gate of an amplification transistor,
wherein, in a configuration in which a plurality of pixels are arranged with respect to at least either of one of the OCCFs or one of the OCLs, the FD is shared by a sharing unit including a plurality of pixels, the plurality of pixels including pixels of at least either of different OCCFs or different OCLs.

REFERENCE SIGNS LIST

TR1 Reset transistor
TR2, TR2-1 to TR2-8 Transfer transistor
TR3 Amplification transistor
TR11 Reset transistor
TR12, TR12-1 to TR12-8 Transfer transistor
TR13 Amplification transistor
TR14 Selection transistor
PD, PD1 to PD8 Photo diode
FD Floating diffusion

The invention claimed is:
1. An imaging device comprising:
a first unit including a first set of four photoelectric conversion regions, a first set of four transfer transistors, a first floating diffusion, and a first set of two color filters;
a second unit including a second set of four photoelectric conversion regions, a second set of four transfer transistors, a second floating diffusion, and a second set of two color filters, wherein the first unit and the second unit are arranged along a horizontal direction;
a wiring coupled to the first floating diffusion and the second floating diffusion;
shared transistors including at least an amplification transistor having a gate coupled to the first floating diffusion and the second floating diffusion via the wiring, the shared transistors arranged in the horizontal direction; and
a first vertical signal line coupled to the amplification transistor, the first vertical signal line extending along a vertical direction,
wherein,
each transfer transistor in the first set of four transfer transistors is coupled to a respective photoelectric conversion region in the first set of four photoelectric conversion regions,
each transfer transistor in the second set of four transfer transistors is coupled to a respective photoelectric conversion region in the second set of four photoelectric conversion regions,
the transfer transistors in the first set of four transfer transistors are coupled to the first floating diffusion and are arranged around the first floating diffusion in a plan view,
the transfer transistors in the second set of four transfer transistors are coupled to the second floating diffusion and are arranged around the second floating diffusion in the plan view,
each color filter in the first set of two color filters is disposed above two photoelectric conversion regions in the first set of four photoelectric conversion regions, wherein the two photoelectric conversion regions are arranged along the horizontal direction, and
each color filter in the second set of two color filters is disposed above two photoelectric conversion regions in the second set of four photoelectric conversion regions, wherein the two photoelectric conversion regions are arranged along the horizontal direction.
2. The imaging device according to claim 1, further comprising:
a second vertical signal line coupled to the amplification transistor, the second vertical signal line extending along the vertical direction.
3. The imaging device according to claim 1,
wherein the shared transistors further include a reset transistor and a selection transistor,
wherein the reset transistor, the selection transistor and the amplification transistor are arranged in a first row,
wherein the first floating diffusion and the second floating diffusion are arranged in a second row, and
wherein the first vertical signal line is coupled to the amplification transistor via a selection transistor.
4. The imaging device according to claim 3, further comprising:
a first well contact and a second well contact,
wherein the reset transistor, the selection transistor, and the amplification transistor are arranged between the first well contact and the second well contact, and
wherein the first well contact and the second well contact are arranged along the horizontal direction along a side of the first unit and the second unit, and
wherein the amplification transistor is arranged between the reset transistor and the selection transistor in the first row.
5. The imaging device according to claim 1,
wherein each of the photoelectric conversion regions in the first set of four photoelectric conversion regions is provided such that a vertical length of the photoelectric conversion region is longer than a horizontal length of the photoelectric conversion region, and wherein each of the photoelectric conversion regions in the second set of four photoelectric conversion regions is provided such that the vertical length of the photoelectric conversion region is longer than the horizontal length of the photoelectric conversion region.

6. The imaging device according to claim 1,
wherein the first set of two color filters includes,
a first color filter configured to extract light incident on the first color filter within a first wavelength range, and
a second color filter configured to extract light incident on the second color filter within a second wavelength range, and
wherein the second set of two color filters includes,
a third color filter configured to extract light incident on the third color filter within a third wavelength range, and
a fourth color filter configured to extract light incident on the fourth color filter within a fourth wavelength range.

7. The imaging device according to claim 6,
wherein the first color filter and the fourth color filter are arranged in a diagonal direction, and
wherein the first wavelength range and the fourth wavelength range are substantially the same.

8. An electronic apparatus comprising:
the imaging device according to claim 1.

9. An imaging device comprising:
a first unit including a first plurality of photoelectric conversion regions, a first plurality of transfer transistors, a first floating diffusion, and a first set of two color filters;
a second unit including a second plurality of photoelectric conversion regions, a second plurality of transfer transistors, a second floating diffusion, and a second set of two color filters, wherein the first unit and the second unit are arranged along a horizontal direction;
a wiring coupled to the first floating diffusion and the second floating diffusion;
shared transistors including an amplification transistor coupled to the first floating diffusion and the second floating diffusion via the wiring, wherein the shared transistors are arranged in a first row and wherein the first floating diffusion and the second floating diffusion are arranged in a second row; and
a first vertical signal line coupled to the amplification transistor, the first vertical signal line extending along a vertical direction,
wherein,
each transfer transistor of the first plurality of transfer transistors is coupled to at least one of the first plurality of photoelectric conversion regions,
each transfer transistor of the second plurality of transfer transistors is coupled to at least one of the second plurality of photoelectric conversion regions,
the first plurality of transfer transistors are coupled to the first floating diffusion,
the second plurality of transfer transistors are coupled to the second floating diffusion,
each of the color filters in the first set of two color filters is disposed above two photoelectric conversion regions in the first plurality of photoelectric conversion regions, wherein the two photoelectric conversion regions are arranged along the horizontal direction, and
each of the color filters in the second set of two color filters is disposed above two photoelectric conversion regions in the second plurality of photoelectric conversion regions, wherein the two photoelectric conversion regions are arranged along the horizontal direction.

10. The imaging device according to claim 9, further comprising:
a second vertical signal line coupled to the amplification transistor, the second vertical signal line extending in the vertical direction.

11. The imaging device according to claim 9,
wherein the first vertical signal line is coupled to the amplification transistor via a selection transistor.

12. The imaging device according to claim 9,
wherein the shared transistors further include a reset transistor and a selection transistor, and
wherein the reset transistor, the selection transistor and the amplification transistor are arranged in the first row.

13. The imaging device according to claim 12, further comprising:
a first well contact and a second well contact,
wherein the reset transistor, the selection transistor, and the amplification transistor are arranged between the first well contact and the second well contact.

14. The imaging device according to claim 12,
wherein the amplification transistor is arranged between the reset transistor and the selection transistor in the first row.

15. The imaging device according to claim 14,
wherein the second unit is provided right of the first unit along the horizontal direction, and wherein the reset transistor, the amplification transistor, and the selection transistor are arranged in order from left to right along the horizontal direction in the first row.

16. The imaging device according to claim 9, wherein,
each of the photoelectric conversion regions in the first plurality of photoelectric conversion regions is provided such that a vertical length of the photoelectric conversion region is longer than a horizontal length of the photoelectric conversion region, and
each of the photoelectric conversion regions in the second plurality of photoelectric conversion regions is provided such that the vertical length of the photoelectric conversion region is longer than the horizontal length of the photoelectric conversion region.

17. The imaging device according to claim 9, wherein,
the first set of two color filters includes,
a first color filter extracting light having a first wavelength range, and
a second color filter extracting light having a second wavelength range, and the second set of two color filters includes,
a third color filter extracting light having a third wavelength range, and
a fourth color filter extracting light having a fourth wavelength range.

18. The imaging device according to claim 17, wherein,
the first color filter and the fourth color filter are arranged in a diagonal direction,
the first wavelength range, the second wavelength range and third wavelength range are different, and
the first wavelength range and the fourth wavelength range are substantially the same.

19. An electronic apparatus comprising:
the imaging device according to claim 9.

20. An imaging device comprising:
a first unit including a first plurality of transfer transistors, a first floating diffusion, a first color filter and a second color filter;

a second unit including a second plurality of transfer transistors, a second floating diffusion, a third color filter and a fourth color filter, wherein the first unit and the second unit are arranged along a horizontal direction;

a wiring coupled to the first floating diffusion and the second floating diffusion;

an amplification transistor coupled to the first floating diffusion and the second floating diffusion via the wiring, wherein a reset transistor, a selection transistor and the amplification transistor are arranged in a first row, and wherein the first floating diffusion and the second floating diffusion are arranged in a second row; and a first vertical signal line coupled to the amplification transistor, the first vertical signal line extending along a vertical direction, wherein, the first plurality of transfer transistors are coupled to the first floating diffusion and are arranged around the first floating diffusion in a plan view, the second plurality of transfer transistors are coupled to the second floating diffusion and are arranged around the second floating diffusion in the plan view, each of the first color filter and the second color filter is disposed above two transfer transistors of the first plurality of transfer transistors, wherein the two transfer transistors are arranged along the horizontal direction, and each of the third color filter and the fourth color filter are disposed above two transistors of the second plurality of transfer transistors, the two transistors are arranged along the horizontal direction.

21. The imaging device according to claim 20, further comprising: a second vertical signal line coupled to the amplification transistor, the second vertical signal line extending along the vertical direction.

22. The imaging device according to claim 20, wherein the first vertical signal line is coupled to the amplification transistor via a selection transistor.

23. The imaging device according to claim 20, further comprising:

a first well contact and a second well contact, wherein the reset transistor, the selection transistor, and the amplification transistor are arranged between the first well contact and the second well contact.

24. The imaging device according to claim 20, wherein the amplification transistor is arranged between the reset transistor and the selection transistor in the first row.

25. The imaging device according to claim 24, wherein the reset transistor, the selection transistor, and the amplification transistor are arranged along a side of the first unit and the second unit.

26. The imaging device according to claim 20, further comprising:

a first well contact and a second well contact, wherein the first well contact and the second well contact are arranged along the horizontal direction along a side of the first unit and the second unit.

27. The imaging device according to claim 20, wherein, the first color filter is configured to extract light incident on the first color filter within a first wavelength range, the second color filter is configured to extract light incident on the second color filter within a second wavelength range, the third color filter is configured to extract light incident on the third color filter within a third wavelength range, and the fourth color filter configured to extract light incident on the fourth color filter within a fourth wavelength range.

28. The imaging device according to claim 27, wherein, the first color filter and the fourth color filter are arranged along a diagonal direction, the first wavelength range, the second wavelength range and the third wavelength range are different, and the first wavelength range and the fourth wavelength range are substantially the same.

29. An electronic apparatus comprising:

the imaging device according to claim 20.

* * * * *